United States Patent [19]

Sugihara et al.

[11] Patent Number: 5,585,574
[45] Date of Patent: Dec. 17, 1996

[54] SHAFT HAVING A MAGNETOSTRICTIVE TORQUE SENSOR AND A METHOD FOR MAKING SAME

[75] Inventors: Tadashi Sugihara; Kazushi Yoshida, both of Saitama-ken; Kazutoshi Inoue, Tiba-ken; Ji-bin Yang, Niigata-ken; Isao Suzuki, Saitama-ken, all of Japan

[73] Assignee: Mitsubishi Materials Corporation, Tokyo, Japan

[21] Appl. No.: 195,375

[22] Filed: Feb. 14, 1994

[30] Foreign Application Priority Data

Feb. 2, 1993 [JP] Japan ................................. 5-015526
Feb. 12, 1993 [JP] Japan ................................. 5-024007
Sep. 14, 1993 [JP] Japan ................................. 5-252198

[51] Int. Cl.$^6$ ..................................................... G01L 5/00
[52] U.S. Cl. ............................... 73/862.334; 73/862.333
[58] Field of Search ...................... 73/862.333, 862.334, 73/862.335, 862.336

[56] References Cited

U.S. PATENT DOCUMENTS

| | | | |
|---|---|---|---|
| 4,760,745 | 8/1988 | Garshelis | 73/862.333 |
| 4,991,447 | 2/1991 | Yahagi et al. | 73/862.334 |
| 5,107,711 | 4/1992 | Aoki et al. | 73/862.333 |
| 5,280,729 | 1/1994 | Aoki et al. | 73/862.333 |

FOREIGN PATENT DOCUMENTS

| | | |
|---|---|---|
| 59-61730 | 4/1984 | Japan . |
| 59-61731 | 4/1984 | Japan . |
| 59-181575 | 10/1984 | Japan . |
| 60-123078 | 7/1985 | Japan . |
| 60-234948 | 11/1985 | Japan . |
| 61-15942 | 1/1986 | Japan . |
| 62-184323 | 8/1987 | Japan . |
| 63-20031 | 4/1988 | Japan . |
| 63-215927 | 9/1988 | Japan . |
| 4-24530 | 5/1992 | Japan . |
| 4-155232 | 5/1992 | Japan . |
| 4-214849 | 8/1992 | Japan . |
| 4-346043 | 12/1992 | Japan . |
| 5-5660 | 1/1993 | Japan . |
| 5-52678 | 3/1993 | Japan . |

*Primary Examiner*—Richard Chilcot
*Assistant Examiner*—Ronald Biegel
*Attorney, Agent, or Firm*—Morrison Law Firm

[57] ABSTRACT

A shaft having a magnetostrictive sensor measures torque applied to a shaft, as a shaft, without contact and utilizing reverse-magnetostrictive properties of magnetic alloys. The shaft includes a plurality of magnetic alloy layers, and the magnetosensitive torque detector is variously formed by diffusion bonding a magnetostrictive layer with a high magnetostrictive constant onto the shaft surface, by heat treating, adhesive fixation or the like bonding means. Methods for making the shaft are disclosed.

16 Claims, 19 Drawing Sheets

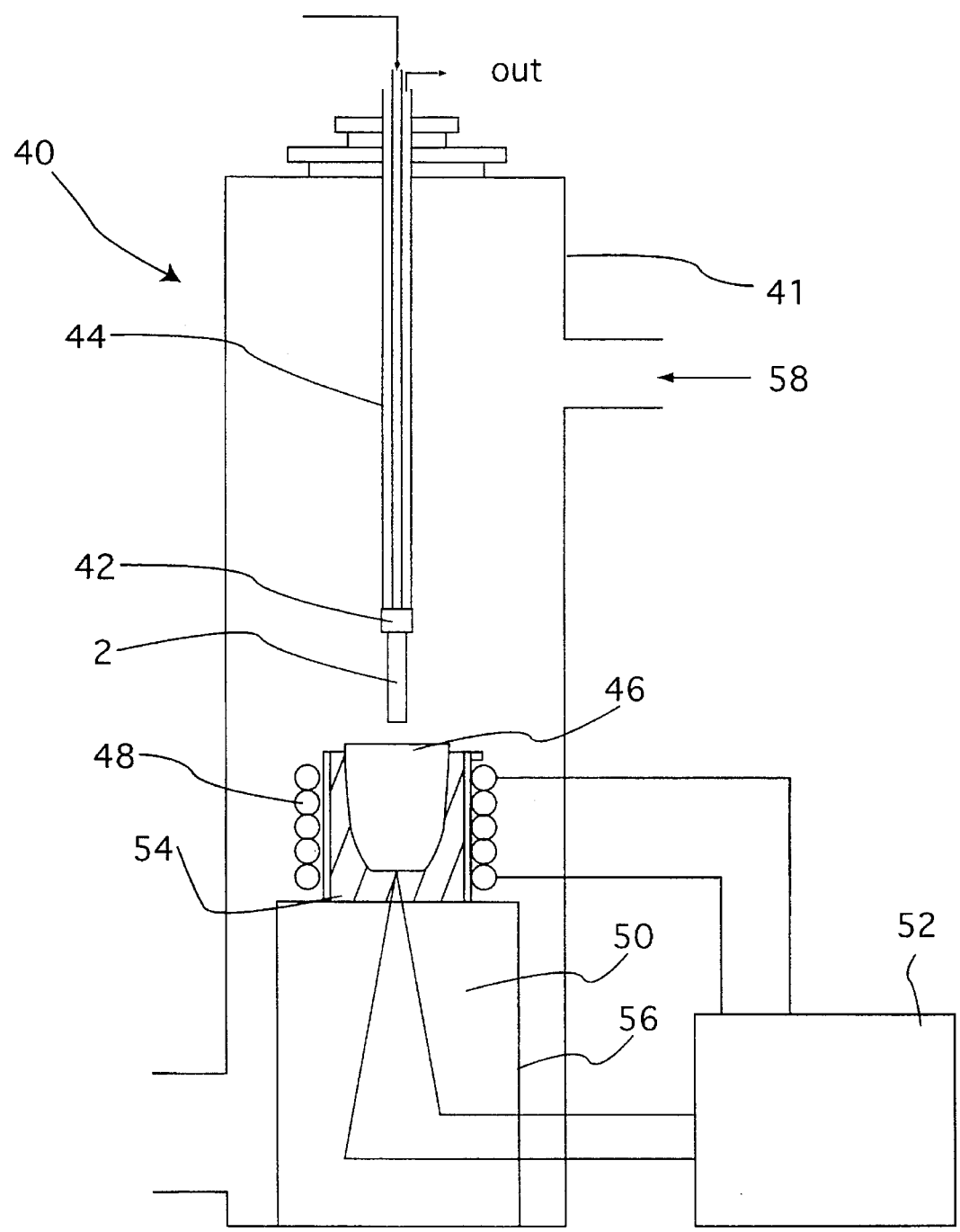

SHAFT HAVING A MAGNETOSTRICTIVE TORQUE SENSOR AND A METHOD FOR MAKING SAME

BACKGROUND OF THE INVENTION

The present invention relates to a shaft having magnetostrictive properties. The present invention further relates to a shaft with a magnetostrictive sensor for measuring a torque applied to a shaft, more particularly without contact and using the reverse-magnetostrictive effect of magnetic alloys. The present invention also relates to a method for making the same.

Ferromagnetic substances are characterized by showing slight changes in dimensions when they are magnetized and, conversely, by changing permeability when an outside force is applied to produce elastic deformation. The former is referred to as the magnetostrictive effect, and the latter as the reverse-magnetostrictive effect.

The saturation magnetostrictive constant lambda is used as an index for the degree of this effect. A sensor that magnetically detects torque applied to a rotating shaft using the above reverse-magnetostrictive effect is called a magnetostrictive torque sensor.

In shafts used in motors, machine tools and the like, the torque applied to the shaft is generally measured for the purpose of output control or of controlling changes in drive power. Magnetostrictive torque sensors are used for measuring this torque.

Known prior art magnetostrictive torque sensors include a magnetostrictive torque detector in which the shaft itself is composed of steel having a magnetic effect. An example is disclosed in Japanese laid-open publication no. 63-81993.

The prior art also includes shafts having a thin band of magnetic metal joined to the shaft surface with a synthetic resin adhesive or the like, forming a layer of magnetostrictive material as a magnetostrictive torque detector. An example of this type is disclosed in Japanese laid-open patent no. 63-163243. To effectively measure applied torque, the stress from the torque acting upon the shaft must be transmitted to the magnetostrictive material layer in order to detect torque from the shaft. Changes in permeability due to the reverse magnetostrictive effect of the magnetostrictive material layer may then be detected without contact from the outside.

However, the aforementioned prior art magnetostrictive torque sensors have the following problems. The former shaft having a magnetostrictive torque detector using the magnetostrictive effect of the shaft itself has a lower magnetostrictive effect compared to the latter shaft in which the magnetostrictive material layer is arranged separately, resulting in a lower sensitivity for torque detection. Thus, torque sensors using the former shaft involve complicated and expensive processing circuitry. In the latter shaft having a separately arranged magnetostrictive material layer, although corrosion resistance of the magnetostrictive material layer can be maintained, adequate adhesive strength between the magnetostrictive material layer and the shaft can not be obtained because the magnetostrictive material layer is bonded with a glue. Deterioration of the bond between the shaft and the magnetostrictive material layer is possible, particularly where the magnitude of the torque applied to the shaft is increased, or under environmental conditions of high temperature or high humidity. This results in decreased reliability.

Precision correlation between the applied torque and the detected change in permeability may be adversely affected in the latter prior art shaft. Since the ratio between the torque applied to the shaft and the binding strength of the synthetic resin adhesive decreases as the torque increases, adequate transmission of stress on the shaft to the magnetostrictive material layer is prevented. Further inaccuracies are believed to be caused by deterioration of the synthetic resin adhesive itself due to change over time and environmental operating temperature.

Additionally, Japanese laid-open patent publication no. 4-155232 discloses a method for producing a shaft with a magnetostrictive torque detector having a magnetostrictive material layer formed on the shaft surface without using adhesive. A nickel membrane is plated on the shaft surface, as a middle surface, upon which is plated a permalloy layer which is then heat treated. The use of a permalloy layer as the magnetostrictive material layer, as disclosed in this publication, allows relatively easy production with plating. However, the magnetostrictive constant of the permalloy layer is about $2-3 \times 10^{-6}$. This is inferior in reverse magnetostrictive qualities compared to metallic de-crystallized magnetostrictive material layers, which have a magnetostrictive constant of $30-40 \times 10^{-6}$. The plating method disclosed in this publication cannot be practicably implemented to bond the shaft and a ferrous de-crystallized magnetostrictive material layer having superior reverse-magnetostrictive qualifies, making the use of adhesive (as discussed above) a necessary step.

OBJECT AND SUMMARY OF THE PRESENT INVENTION

The object of the present invention is to solve the problems of the prior art and to provide a shaft with a highly reliable magnetostrictive torque detection device that is capable of bonding the shaft and a magnetostrictive material layer having superior reverse-magnetostrictive properties with an adequate bonding strength and that can also perform high sensitivity torque detection.

In order to achieve the above object, the shaft with a magnetostrictive torque detector of the present invention is formed by diffusion-bonding a magnetostrictive material layer having a high magnetostrictive constant onto the shaft surface.

The shaft with a magnetostrictive torque detector of the present invention can be composed of the following: $Fe_X B_m Si_n$ [X+m+n=1.0, where 0.65<X<0.80; 0.20<m+n<0.35, 0.02<m<0.33]; $(Fe_{0.9}Co_{0.1})_{0.78}Si_XB_Y$[X+Y=0.22]; $(Fe_XNi_Y)Mo_mB_n$[X+Y+m+n=1.0, where 0.70<X+Y<0.80, 0.30<X<0.50, 0.20<m+n<0.30, 0.02<m<0.10] ;$(Fe_{0.9}Co_{0.1})_{0.78}Si_XB_Y$[X+Y=0.22];Co-40% Fe; Fe-13% Al; $Fe_3O_4$; $TbFe_2$; Tb-30% Fe; $Tb(CoFe)_2$; $Tb(NiFe)_2$; $TbFe_3$; $DyFe_3$ or the like.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 8 is a summary drawing of a device for heat treatment dipping used in production embodiment 5, 6.

DETAILED DESCRIPTION OF THE PREFERRED EMBODIMENTS

Figure 1:
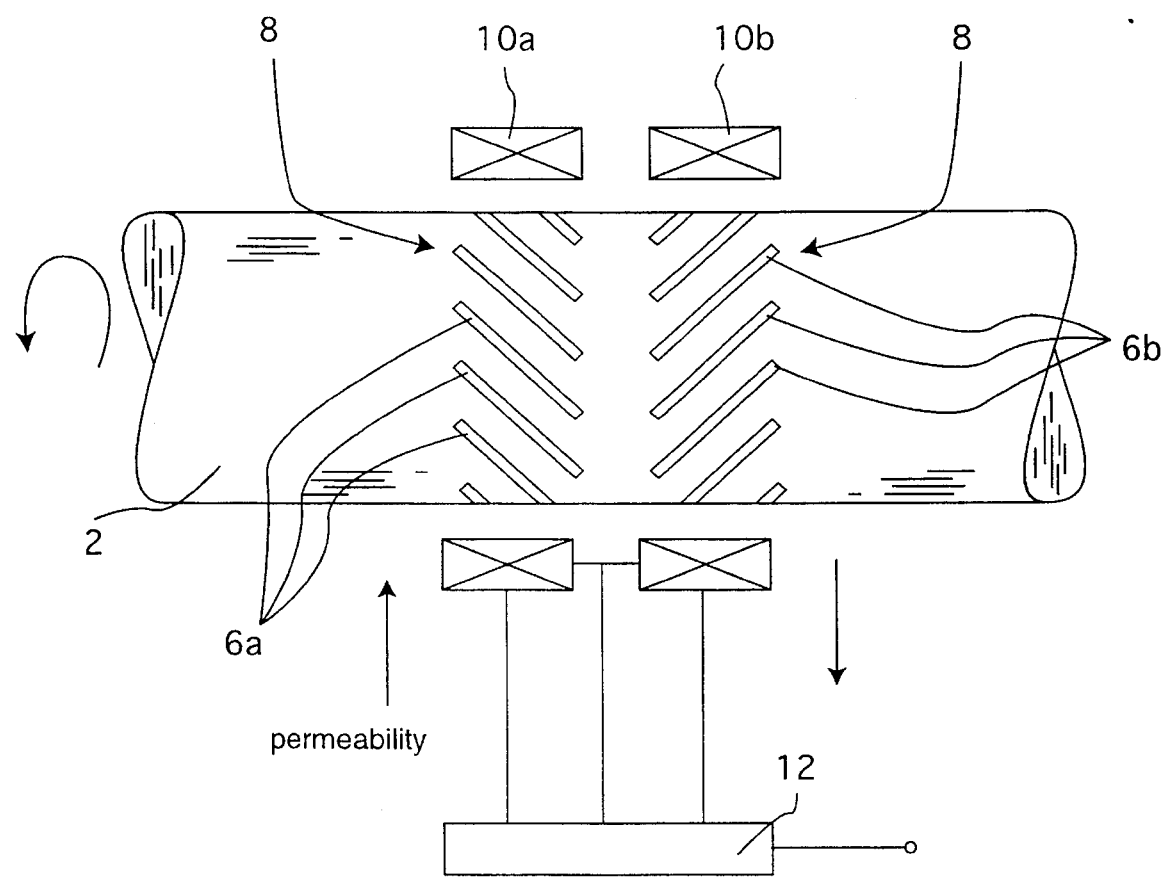
FIG. 1 is a drawing of the overall composition of a torque sensor using a shaft having a magnetostrictive torque detector.

The method of production can involve immersing a shaft in a crucible in which a magnetostrictive material has been melted, thus diffusion-bonding a magnetostrictive material layer onto the shaft surface. It is also possible to have a magnetostrictive material layer held onto a shaft and then have heat treatment performed on the shaft surface with the layer held onto it, thus diffusion-bonding the magnetostrictive material onto the shaft surface.

Furthermore, the qualities of the shaft with a magnetic torque sensor of the present invention can be further improved by performing, following the above production procedure, a heat treatment using beam exposure. By selecting the composition of the magnetostrictive material formed on the shaft surface, the magnetostrictive material layer can be made de-crystallized. Additionally, by forming an intermediate layer between the shaft and the magnetostrictive material layer, the degree of mutual diffusion between the magnetostrictive material layer and the shaft can be controlled, preventing a composition shift in the magnetostrictive material layer from affecting magnetostrictive qualities. It would also be desirable to form the magnetostrictive torque detector by pattern-processing the magnetostrictive material layer that has been diffusion-bonded so that the shaft torque can be detected.

In the shaft with a magnetostrictive detector and the method for making the same of the present invention, the magnetostrictive material layer is fixed directly to the shaft surface by being diffusion-fused without the use of an adhesive. The magnetostrictive layer fixed to the shaft operates in that form as a crystallized magnetostrictive layer, and furthermore, by the use of electron beam or a laser beam exposure, it is possible to make it de-crystallized, thus improving its magnetic properties.

If the magnetostrictive material layer is formed not directly on the outer perimeter of the shaft, but rather indirectly via an intermediate layer, the intermediate layer firmly bonds the magnetostrictive material layer to the shaft. As a result, the transmission of torque from the shaft to the 2 magnetostrictive material layer is improved, thus making torque detection more reliable. It goes without saying that the de-crystallization of the magnetostrictive material layer allows highly sensitive detection of torque. Also, the intermediate layer serves to prevent shaft material components such as Mn or Cr contained in the shaft (harmful to reverse-magnetostrictive effect) from diffusing into the magnetostrictive material layer. Thus, deterioration of the magnetostrictive layer's reverse-magnetostrictive properties is averted. When shaft material components such as Mn or Cr mix into the magnetostrictive layer, counter-magnetostrictive properties diminish. For example, when de-crystallized magnetostrictive material is bonded to the shaft surface, the ribbon that forms the de-crystallized magnetostrictive material becomes liquid due to the heat treatment during bonding. This increases the speed of the diffusion of impurities diffusing into the magnetostrictive material from the shaft material, causing large amounts of shaft material components to diffuse into the magnetostrictive material. This could deteriorate counter-magnetostrictive properties, so heat treatment must be performed carefully. In contrast to this, if an intermediate layer is used and heat treatment for bonding is performed, the shaft temperature approaches the melting point of the de-crystallized magnetostrictive material, but since this temperature is lower than the melting point of the intermediate layer and the shaft (1400 degrees C. in the case of Ni), solid parts are thought to remain in the intermediate layer. For this reason, the shaft components diffuse into the intermediate layer, and the rate of diffusion is slower compared to the rate of diffusion in a liquid. From this perspective, it would be desirable to have the intermediate layer composed of a material whose melting point is greater than that of the de-crystallized magnetostrictive material, and it would also be desirable for it to have a slower diffusion rate for impurities within solids. Specifically, it would be desirable to use at least one or an alloy of the following: Ni, Nb, Mo, Zn, Fe, Y, Sc, Ti, Hf, Ta, W, Co, Rh, Ir, Pd, Pt. Especially desirable for the intermediate layer would be at least one or an alloy of Ni, Nb, Mo, Zn, Fe. The desirable thickness of this intermediate layer would be 10–100 micrometers. This is to transmit torque from the shaft in a highly sensitive manner, and also to prevent the diffusion of impurity elements from the shaft. Also, in order to use an excitation frequency of tens of kHz for the magnetostrictive sensor, a thickness of 20 micrometers or greater for the magnetostrictive material would be desirable.

Referring now to FIG. 1, an illustration is provided of the overall composition of a torque sensor of the present invention using a shaft having a magnetostrictive torque detector. The composition of a preferred embodiment of the magnetostrictive torque sensor of the present invention is shown. Magnetostrictive torque detectors 8 are formed on shaft 2, having a magnetostrictive torque sensor, by having magnetostrictive material 6 diffusion-bonded to shaft 2. Magnetostrictive torque detectors formed on shaft 2, form a two-row chevron pattern inclined in a 45 degree angle in the opposite direction to the shaft axis.

On the outer perimeter of shaft 2, where each pattern is formed, there is arranged an excitation coil (not indicated in the drawing) with a gap of about 2 mm or more. These excitation coils are connected to an alternating current power source (not indicated in the drawing) that can range from a few kHz to hundreds of kHz. Adequate saturation of alternating current magnetic field is thereby provided for magnetostrictive material 6a, 6b, which serves as magnetostrictive torque detectors 8 formed on the surface of shaft 2. Detection coils 10a, 10b are arranged around the excitation coil, corresponding to the two-row pattern of magnetostrictive torque detector 8 formed on shaft 2. Detection coils 10a, 10b are connected to each other on one end, and the other end of each is connected to a means for differential detection 12, forming the magnetostrictive torque sensor.

By arranging magnetostrictive torque detectors 8, so that they form a two-row chevron pattern inclined 45 degrees in the direction opposite to the axis of shaft 2, compressive stress is applied to one pattern when shaft turns in one direction, and tensile stress is applied to the other pattern. Thus, detection coils 10a, 10b and means for differential detection 12, which function as a magnetostrictive torque sensor, measure the difference in permeability based on these stresses, a torque applied to the shaft can be measured thereby. Means for differential detection 12 can be a differential amp or the like. Also, the difference in the change in permeability noted above can be detected by a magnetic head as well.

The present invention is described in detail hereinafter with reference to various embodiments described hereinafter.

Embodiment 1—Crystallized

Figure 2:
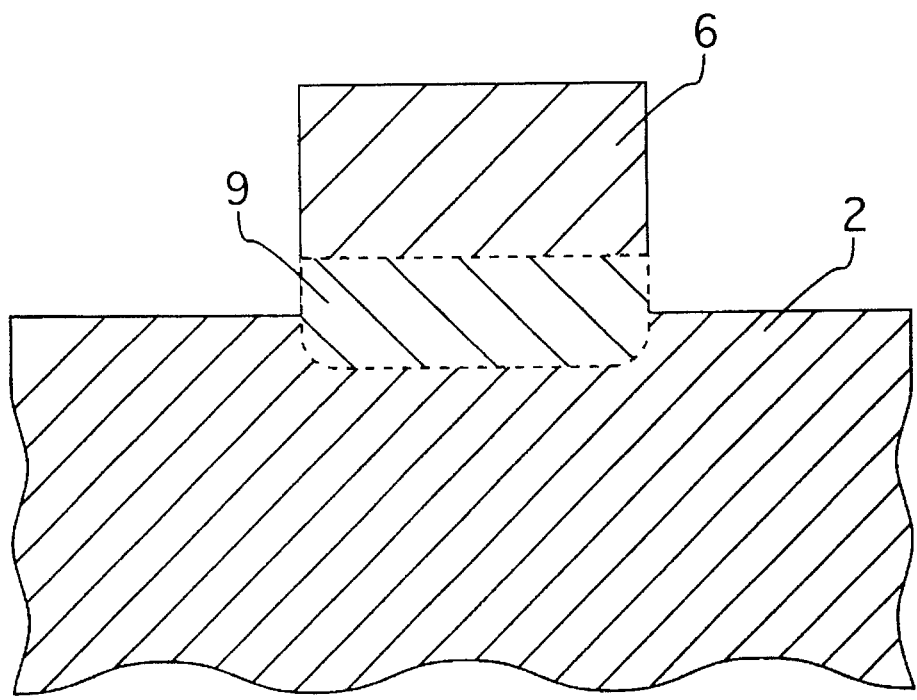
FIG. 2 is a summary cross-section drawing indicating the main parts of a shaft having a magnetostrictive torque detector as in embodiments 1, and 2 of the present invention.

Referring to FIG. 2, magnetostrictive material 6 formed in a chevron pattern as noted above is formed on the surface of shaft 2 via mutual diffusion layer 9. These magnetostrictive layers 6 are layers formed from crystallized magnetic alloys having a magnetostrictive constant of $10 \times 10^{-6}$ or greater including the following, among Fe(Co)—Si—B alloys:

$Fe_xB_mSi_n$[X+m+n=1.0, 0.65<X<0.80, 0.20<m+n<0.35, 0.02<m<0.33], $(Fe_{0.9}Co_{0.1})_{0.78}Si_XB_Y$[X+Y=0.22].$(Fe_X Ni_Y)Mo_mB_n$[X+Y+m+n=1.0, 0.70<X+Y<0.80, 0.30<X<0.50, 0.20<m+n<0.30, 0.02<m<0.10], $(Fe_{0.9}Co_{0.1})_X(Si_mB_n)_Y$[X+Y=0.1, 0.75<X<0.90, 0.25<Y<0.10, and m+n=1, 0.2<m<0.8, 0.2<n<0.8], $(Fe_{0.9}Co_{0.1})_{0.78}Si_XB_Y$[X+Y=0.22],Co-40% Fe, Fe-13% Al, $TbFe_2$, Tb-30% Fe, $Tb(CoFe)_2$, $Tb(NiFe)_2$, $TbFe_3$, $DyFe_2$, and the like.

Mutual diffusion layer 9 is formed by mutual diffusion between this crystallized magnetic alloy and the steel material of shaft 2.

As shown in FIG. 1, when torque is applied to shaft 2, the magnetostrictive layer 6a, which is in strip form, receives stress lengthwise and its permeability increases. Conversely, the permeability of magnetostrictive layer 6b, which receives stress width-wise, decreases. As a result of these changes, a change in mutual inductance is generated between the excitation coil (not indicated in the drawings), and detection coils 10a, 10b. By detecting these changes, the torque applied to shaft 2, can be measured. Furthermore, since the inductive coupling between magnetostrictive layer 6a, 6b, and coils 10a, 10b, are the symmetry of rotation, changes in permeability can be detected regardless of the rotation of shaft 2. In addition, the change in permeability noted above can be measured using a magnetic head.

Embodiment 2—Non-crystallized

FIG. 2 is also a cross-section drawing indicating the main parts of a shaft for magnetostrictive torque sensors of embodiment 2, of the present invention. A magnetostrictive layer 6, is formed in a chevron pattern on shaft 2, via a mutual diffusion layer 9. These magnetostrictive layers 6, are composed of high-sensitivity non-crystallized magnetostrictive alloys having magnetostrictive constants of $30 \times 10^{-6}$ or greater, such as non-crystallized $(Fe_{0.9}Co_{0.1})_{0.78}Si_XB_Y$[X+Y=0.22];Co-40% Fe; Fe-13% Al; $Fe_3O_4$; $TbFe_2$; Tb-30% Fe; $Tb(CoFe)_2$; $Tb(NiFe)_2$; $TbFe_3$; $DyFe_2$; or the like.

This mutual diffusion magnetostrictive layer 9, is a layer formed from mutual diffusion between this non-crystallized alloy and the steel of shaft 2.

Embodiment 3—Intermediate layer

Figure 3:
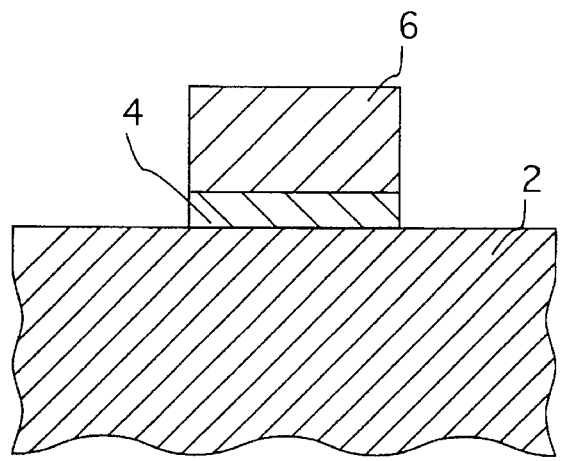
FIG. 3 is a summary cross-section drawing of the main parts of a shaft having a magnetostrictive torque detector of embodiment 3 as in the present invention.

Referring to FIG. 3, magnetostrictive torque detector 8, formed in a pattern similar to that described above, is composed of intermediate layer and magnetostrictive material layer 6, which is stacked via this intermediate layer 4.

Examples of magnetostrictive material layer 6, include non-crystallized alloys with saturated magnetostrictive constants of $30 \times 10^{-6}$ or greater such as: $(Fe_{0.9}Co_{0.1})_{0.78}Si_XB_Y$ [X+Y=0.22]; Co-40% Fe, Fe-13% Al, $Fe_3O_4$, $TbFe_2$, Tb-30% Fe, $Tb(CoFe)_2$, $Tb(NiFe)_2$, $TbFe_3$, $DyFe_2$.

Desirable materials for intermediate layer 4, would have melting points higher than that of the non-crystallized magnetostrictive material layer and would also have a slow rate of diffusion for impurities in the solid. Specifically, examples of these include at least one of, or an alloy of the following: Ni, Nb, Mo, Zn, Fe, Y, Sc, Ti, Hf, Ta, W, Co, Rh, Ir, Pd, Pt. A specific example is a plated Ni or Ni—P layer.

There is no particular specification for the membrane thickness of intermediate layer 4, but it should be thick enough to prevent diffusion of impurities from shaft 2 to magnetostrictive material layer 6, when magnetostrictive torque detector 8 is being formed with heat treatment. The thickness should not be so great as to affect the transmission of torque from shaft 2 to magnetostrictive material layer 6.

Specifically, from about 10 to about 100 μm is operational, and from about 10 to about 50 μm is preferred. The membrane thickness for magnetostrictive material layer 6 should be of a thickness adequate for manifesting counter-magnetostrictive properties. Specifically, about 20 μm or greater is operational, and from about 20 to about 100 μm is preferred.

The boundary between intermediate layer 4 and magnetostrictive material layer 6 after heat treatment does not necessarily have to be clearly defined. Intermediate layer 4, can be a plurality of stacks having differing composition due to heat diffusion of shaft material from shaft 2, during heat treatment for bonding. The shaft material components can be thought of as being thermally diffused in intermediate layer 4 with a prescribed concentration gradient.

Figure 14:
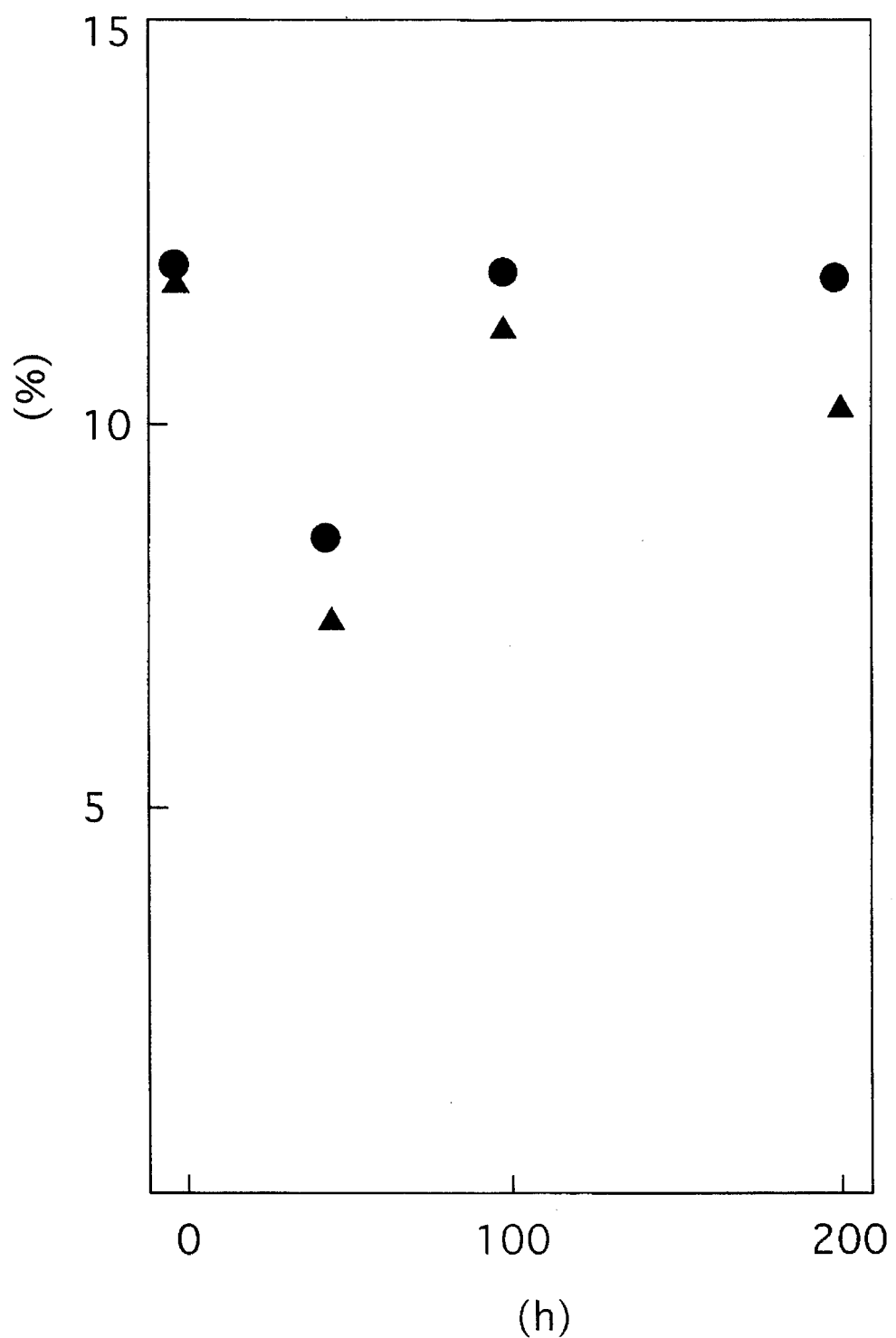
FIG. 14 is a graph indicating the improvement in corrosion resistance due to the nickel in production embodiment 3 of the present invention.

The components of magnetostrictive material layer 6, and intermediate layer 4, are similarly thermally diffused mutually. This improves the corrosion resistance of magnetostrictive material layer 6, because of the diffusion of nickel from intermediate layer 4, to magnetostrictive material layer 6, to an extent that does not affect magnetostrictive properties (As illustrated in FIG. 14).

Production embodiment 1—crystallized slurry

Figure 4:
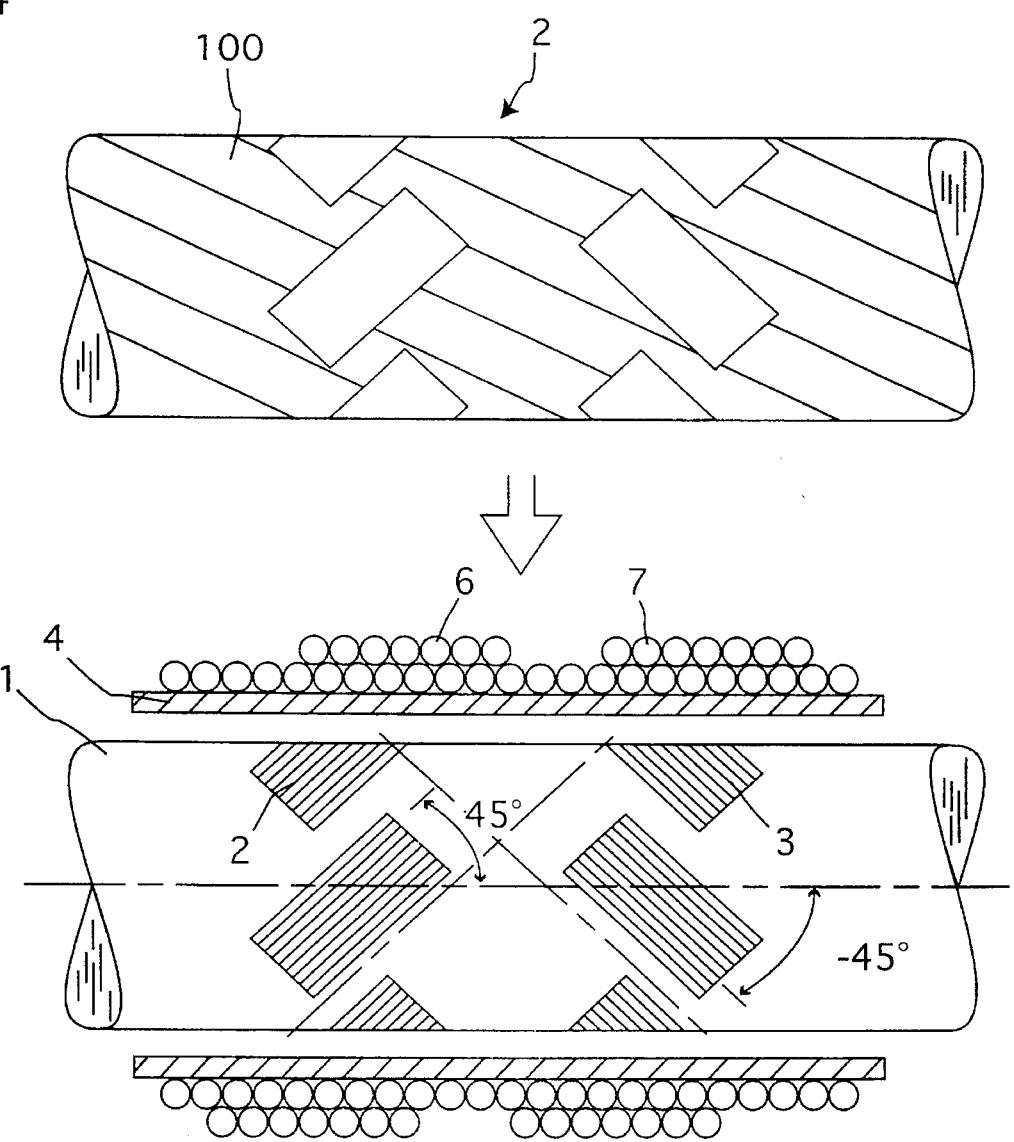
FIG. 4 is a summary drawing indicating a method for making a shaft having a magnetostrictive torque detector as in production embodiments 1, 2.

In this embodiment for a method of producing the torque sensor, a shaft 2 made of SNCM439 steel having diameter 20 mm and length 100 mm was prepared. Referring to FIG. 4, surface of shaft 2 was masked with mask 100 (indicated by the shaded area of the drawing) having a prescribed pattern. A chevron-shaped opening was formed in mask 100.

Then, Fe, Co, Si and B powders were mixed, by weight percent, in the following proportions: about 82.4% of Fe, about 9.7% of Co, about 4.7% of Si, 3.2% of B. A vehicle was added to the powder mixture composed in this way. This vehicle was made by adding 5 weight percent of alpha-terpineol to acrylic resin. The powder mixture and the vehicle were thoroughly mixed, spreading the powder mixture in the vehicle, to form a thick suspension (slurry).

The resultory slurry was applied to surface of shaft 2. Shaft 2 was dried for 10–20 minutes at a temperature of approximately 120 degrees C. This procedure of application and drying was repeated until the slurry layer reached a prescribed thickness, of at least 100 μm.

Shaft 2 was then pre-baked at a baking temperature of from about 280 to about 380 degrees C. This caused the decomposition of the vehicle in the slurry which was previously applied to shaft 2. A membrane composed of Fe—Co—Si—B remained fixed to the surface (the chevron-shaped opening noted above) of shaft 2.

Next, the Fe—Co—Si—B membrane formed on mask 100, was lifted off along with mask 100. As a result, the Fe—Co—Si—B membranes (magnetostrictive layer 6a, 6b) in strip form are opposed to each other, and the length-wise direction of magnetostrictive layers 6a, and 6b, are ±45 degrees relative to the direction of the axis of shaft 2 (see FIG. 1). The arrangement of the magnetostrictive layers 6a, 6b at a ±45 degree angle relative to the direction of the axis of shaft 2's rotation allows response to both maximum tensile stress and maximum compressive stress. This results from the twisting of shaft 2 being at 45 degree angles from shaft 2.

It would also be possible to prepare beforehand ribbons of Fe—Co—Si—B or the like, cut these into magnetostrictive alloy ribbons, and spot weld them to the positions indicated by 6a, 6b in FIG. 1. Alternatively, Cr wire or the like may be used to hold them in place. The alloy components to be used in crystallized magnetostrictive material layer 6, can be items such as the following. Among Fe(Co)—Si—B alloys:

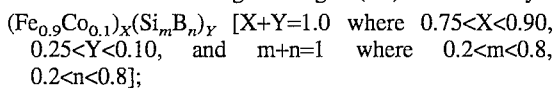
$(Fe_{0.9}Co_{0.1})_X(Si_mB_n)_Y$ [X+Y=1.0 where 0.75<X<0.90, 0.25<Y<0.10, and m+n=1 where 0.2<m<0.8, 0.2<n<0.8];

$(Fe_{0.9}Co_{0.1})_{0.78}Si_XB_Y$ [X+Y=0.22], as well as Co-40% Fe, Fe-13% Al, TbFe$_2$, Tb-30% Fe, Tb(CoFe)$_2$, Tb(NiFe)$_2$, TbFe$_3$, DyFe$_2$.

Next, a high-frequency welding device was used to form a uniform bond on the molecular level at the border surface between the Fe—Co—Si—B membrane and shaft 2. For example, a diffused junction can be welded under the following conditions—vacuum: $10^{-3}$ Torr, high frequency output: 5 kW, time: 10 seconds.

Referring to FIG. 9, layer 9, wherein components of the Fe—Co—Si—B membrane and shaft 2 are mutually diffused, is formed on this border surface. A layer represented by Fe—Co—Si—B wherein $(Fe_{0.9}Co_{0.9})_{0.78}Si_XB_Y$ [X+Y=0.22] layer is formed on the surface of shaft 2 via this mutual diffusion membrane 9. The bonding strength between shaft 2 and the $(Fe_{0.9}Co_{0.1})_{0.78}Si_XB_Y$ layer [X+Y=0.22] is at least 20 kg/mm$^2$ while its durability is at least 107 cycles, wherein one cycle is one rotation when torque is applied.

The processing of the magnetostrictive material layer pattern on the surface of the shaft is achieved by means of a pattern-masking method. However, the masking process can be skipped to allow for an easy uniform application of the resultory slurry by machine-processing concavities on the shaft beforehand.

By taking the shaft on which the magnetostrictive layer is fixed and grinding it in a cylindrical shape, it is possible to maintain the prescribed dimension for the thickness of the magnetostrictive layer membrane. It also permits the elimination of excess magnetostrictive material layer, thus providing a smooth profile and contributing toward the increase of sensitivity for the detector.

Figure 10:
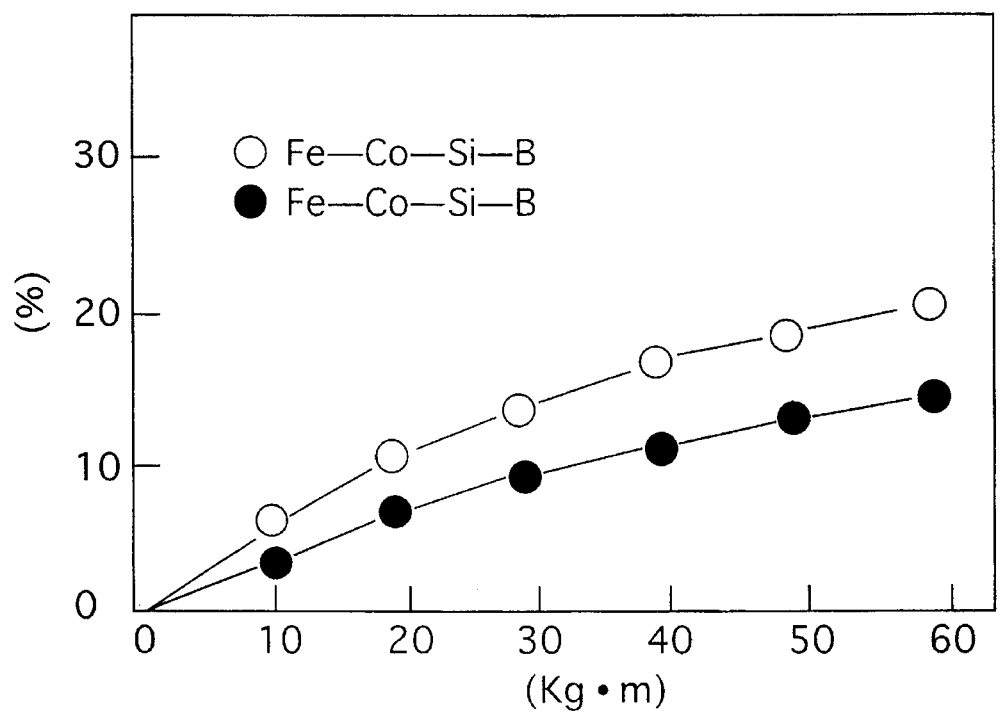
FIG. 10 is a graph indicating the operation of production embodiment 1 of the present invention.

FIG. 10 exhibits results of a study done at room temperature of the change in inductance of magnetostrictive layer 6 relative to the torque applied to shaft 2 (torque detection sensitivity), where shaft 2 is the shaft for the magnetostrictive torque sensor of this embodiment having magnetostrictive detector 8.

Referring to FIG. 10, the black dots indicate the magnetostrictive torque sensor of this embodiment, while the white dots indicate the characteristics of a magnetostrictive layer 6 using the prior art synthetic resin adhesive (epoxy adhesive) to form a non-magnetic magnetostrictive layer, so that a non-crystallized layer covers the surface of the magnetostrictive layer.

The results make clear that the magnetostrictive layer of the present invention provides large magnetic characteristics over a wide range of torques that are not inferior to non-crystallized magnetostrictive layers.

Figure 11:
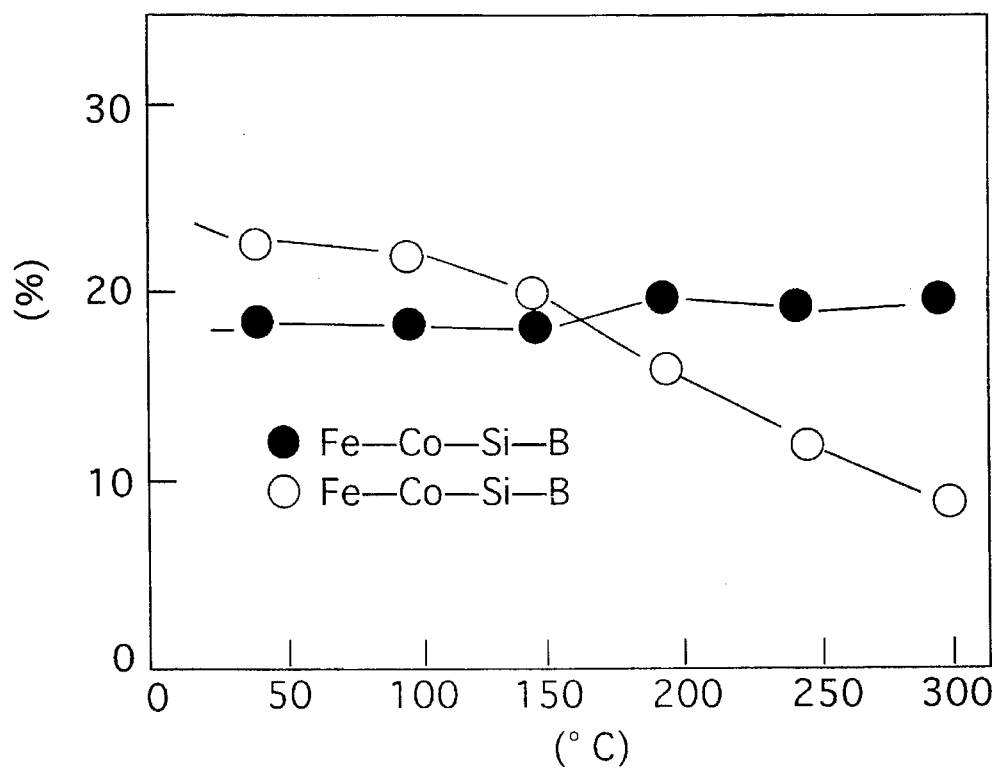
FIG. 11 is a graph indicating the operation of production embodiment 1 of the present invention.

The results shown in FIG. 11 were obtained in a study of characteristics relative to the environmental temperature. In this figure also, the black dots indicate the characteristics of magnetostrictive layer 6 of this embodiment, while the white dots indicate the prior art magnetostrictive layer 6. As these results make clear, in the magnetostrictive torque sensor of this embodiment, stable detection sensitivity was obtained over a wide range of temperatures from low temperature ranges up to high temperatures of 200 degrees C. or greater. This guarantees stable detection sensitivity when used in motors such as internal combustion mechanisms (automobile engines), which have temperatures of approximately 170 degrees C.

Thus, since in this embodiment the magnetic alloy layer is formed firmly on the molecular level on the surface of the drive shaft via a mutual diffusion layer, this embodiment provides superior stress-magnetism conversion sensitivity and linearity even in extreme environments involving high torque or high temperatures such as in automobile engines.

Production embodiment 2—Non-crystallized slurry

The method employed in this embodiment is similar to the previous method according to production embodiment 1, described herein after as the method according to production embodiment 2.

Similar to embodiment 1, shaft 2 was prepared from SNCM439 steel in a cylindrical shape with diameter 20 mm and length 100 mm. Referring to FIG. 4, the surface of this shaft 2 was masked with a mask 100 (indicated in the drawing by the shaded area) having a prescribed pattern. Openings were formed on mask 100 in a chevron formation.

Fe, Co, Si and B of predetermined ratio were mixed, for example, by weight percent, in the following proportions: about 82.4% of Fe, about 9.7% of Co, 4.7% of Si, about 3.2% of B. Similar to embodiment 1, a vehicle was added to the above mentioned powder mixture. The vehicle comprised of, by weight percent, about 5% of alpha-terpineol which was added to an acrylic resin. The powder mixture and the vehicle are thoroughly mixed, spreading the powder mixture in the vehicle, to provide a thick suspension (slurry).

The resultory slurry was applied to surface of shaft 2. Shaft 2 was dried for a predetermined period of time ranging from about 10 to about 20 minutes at a temperature of about 120 degrees C. This procedure was repeated until the slurry application reached a prescribed thickness of at least 100 μm.

Shaft 2 was pre-baked at a baking temperature of from about 20 to about 380 degrees C. This pre-baking step helped decompose the vehicle in the slurry applied previously to shaft 2. A membrane of Fe—Co—Si—B remained fixed to the surface (the chevron-shaped opening noted above) of shaft 2.

Examples of non-crystallized magnetostrictive material alloys that can be selected for this embodiment include the following: $Fe_xB_mSi_n[X+m+n=1.0, 0.65<X<0.80, 0.20<m+n<0.35, 0.02<m<0.33]$, $[Fe_{0.9}Co_{0.1})_{0.78}Si_xB_Y[X+Y=0.22]$, $(Fe_xNi_y)Mo_mB_n[X+Y+m+n=1.0$, where $0.70<X+Y<0.80$, $0.30<X<0.50$, $0.20<m+n<0.30$, $0.02<m<0.10]$, $(Fe_{0.9}Co_{0.1})_{0.78}Si_xB_Y[X+Y=0.22]$, Co-40% Fe, Fe-13% Al, $Fe_3O_4$, $TbFe_2$, Tb-30% Fe, $Tb(CoFe)_2$, $Tb(NiFe)_2$, $TbFe_3$, $DyFe_2$.

The Fe—Co—Si—B membrane formed on mask 100 was lifted off along with mask 100 itself. The resultory strip-shaped Fe—Co—Si—B membranes (magnetostrictive layers 2, 3) were seen opposed to each other, and these magnetostrictive layers 6a, 6b were arranged to form ±45 degree angles relative to the direction of the axis of shaft 2 (FIG. 1).

As in production embodiment 1, it is also possible to prepare beforehand magnetic alloy ribbons of Fe—Co—Si—B or the like, and cut these magnetic alloy ribbons into strips to spot weld them in prescribed positions indicated by 6a, 6b in FIG. 1. It is also possible to hold them down with Cr wire or the like.

Next, a diffusion junction was formed under the same conditions as in production embodiment 1. Referring to FIG. 2, layer 9 was formed on the border surface in which the components of the Fe—Co—Si—B membrane and of shaft 2 are mutually diffused. A $(Fe_{0.9}Co_{0.1})_{0.78}Si_xB_Y$ layer $[X+Y=0.22]$ is formed on the surface of shaft 2 via this mutual diffusion layer 9. The bonding strength between the $(Fe_{0.9}Co_{0.1})_{0.78}Si_xB_Y$ layer $[X+Y=0.22]$ and shaft 2 is 20 kg/mm² or greater and durability is 107 cycles or more, one cycle being one rotation when torque is applied. Grinding the shaft on which the magnetostrictive layer is fixed maintains the prescribed dimension for the thickness of the magnetostrictive layer membrane.

Then, using an electron beam melt quenching device, the Fe—Co—Si—B was transformed into a high-sensitivity non-crystallized $(Fe_{0.9}Co_{0.1})_{0.78}$ $Si_xB_Y[X+Y=0.22]$ membrane. This electron beam melting was conducted in a vacuum of $2\times10^{-4}$ Torr. The step of non-crystallization can be conducted under the following conditions wherein the electron beam output: 1000 W, beam diameter: 0.4 mm, amplitude: 30 mm, frequency: 200 Hz, scan speed: 70 mm/s, exposure time: 10 seconds.

This method of using an electron beam melt quenching device provides a melting depth of 50 micrometers or greater, and also provides a almost uniform distribution of melting depth. Furthermore, it is also possible to control the scan width and the scan direction of the electron beam using a program. Since the electron beam is not a light beam, it can be used regardless of the optical properties of the surface. As a result, an Fe—Co—Si—B membrane with 50 micrometers thickness can be easily non-crystallized to form a high-sensitivity non-crystallized magnetostrictive membrane, while also providing a uniform bond on the molecular level at the border surface between this membrane and shaft 2.

Referring to FIG. 2, layer 9 was formed at this border surface in which the components of this membrane and the components of shaft 2 were mutually diffused. In this embodiment, the pattern processing of the magnetostrictive material layer on the surface of the shaft was achieved by pattern masking before the magnetostrictive layer was fixed. But as indicated in FIG. 9, if concavities were machine-processed onto the shaft beforehand, the masking process can be skipped and the concavity depth can make applying the slurry with a uniform thickness easy.

The shaft on which the magnetostrictive layer is fixed was ground in a cylindrical shape to maintain the prescribed dimension of the magnetostrictive layer membrane thickness. When the magnetostrictive material layer was formed on concavities indicated in FIG. 9, grinding eliminated excess magnetostrictive material layer, providing a detector with a smooth outline, contributing to increased sensitivity. As a result of forming a non-crystallized $(Fe_{0.9}Co_{0.1})_{0.78}Si_xB_Y$ layer $[X+Y=0.22]$ on the surface of shaft 2 via mutual diffusion layer 9, the bonding strength between shaft 2 and the non-crystallized $(Fe_{0.9}Co_{0.1})_{0.78}Si_xB_Y[X+Y=0.22]$ was measured at 20 kg/mm² or greater and the durability was measured at 107 cycles or greater, wherein once cycle is one rotation when torque is applied.

The method for pattern-forming is not limited to the one described above, and can involve forming a mutual diffusion layer by taking non-crystallized alloy ribbons processed beforehand with slit patterns and fixing these to the shaft and melting these by exposing them to an electron beam.

Figure 12:
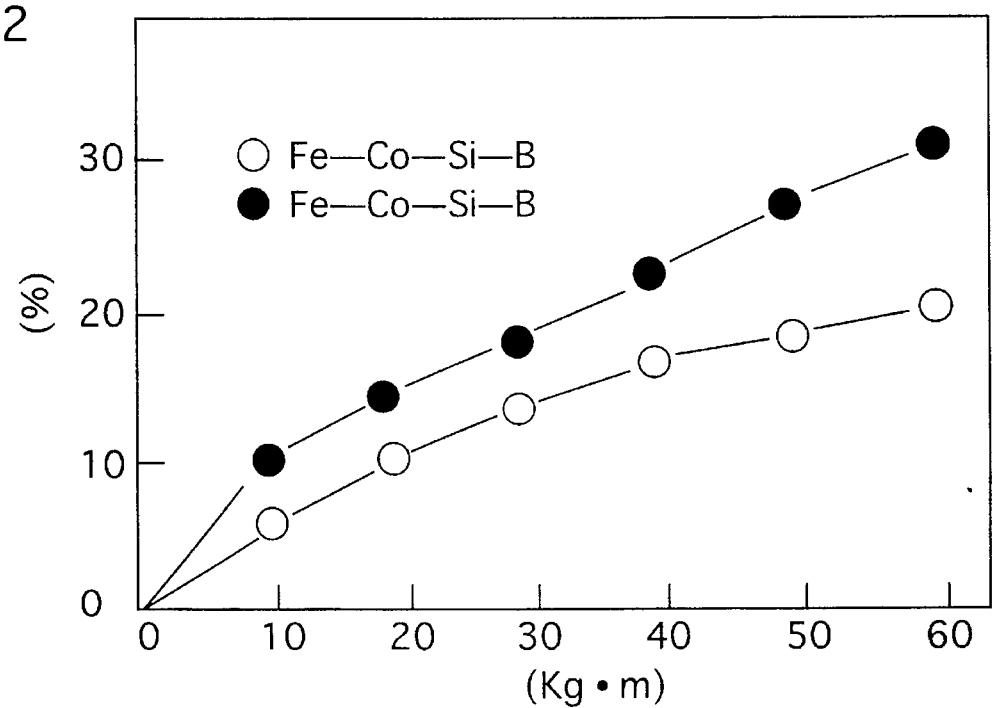
FIG. 12 is a graph indicating the operation of production embodiment 2 of the present invention.

FIG. 12 shows the results from a study on the shaft for the magnetostrictive torque sensor of this embodiment having a magnetostrictive detector 8, in which changes in inductance of magnetostrictive layer 6 (torque detection sensitivity) were recorded relative to the torque applied to shaft 2 at normal temperatures. In this figure, the black dots indicate the characteristics of magnetostrictive layer 6 of this embodiment, while the white dots indicate the characteristics of the prior art magnetostrictive layer 6 formed using synthetic resin adhesive (epoxy adhesive) and covering the surface of the magnetostrictive layer with a non-magnetic material layer. As these results clearly show, the magnetostrictive torque sensor of this embodiment provides great magnetostrictive qualities over a wide range of torques.

Figure 13:
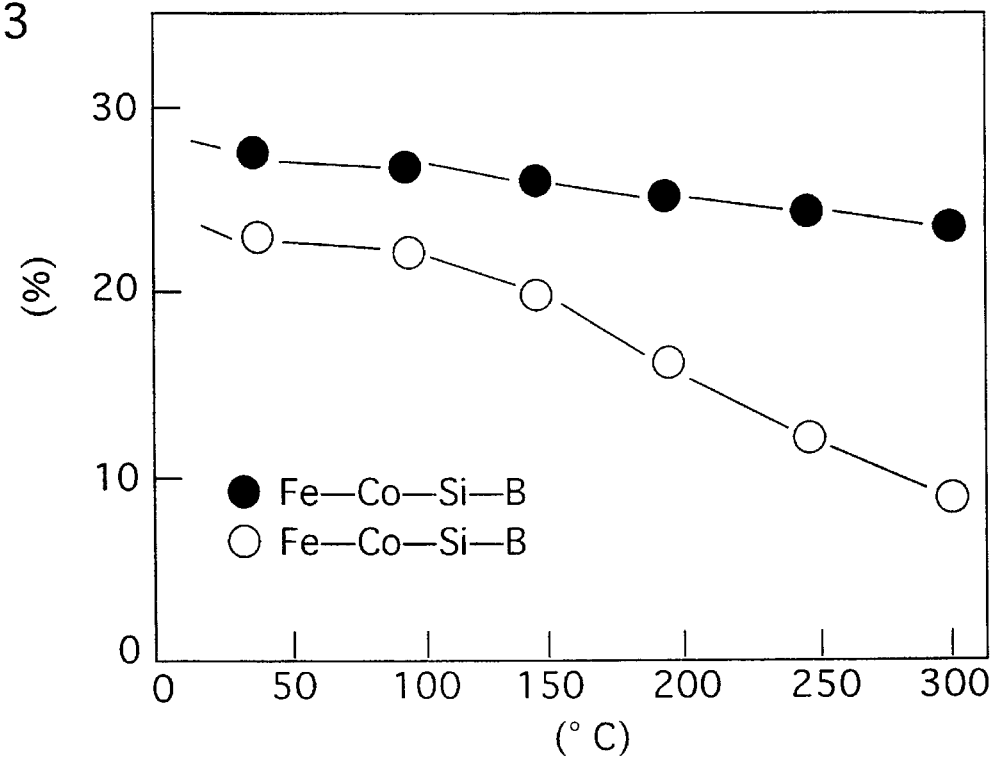
FIG. 13 is a graph indicating the operation of production embodiment 2 of the present invention.

Characteristics relative to environmental temperatures yielded the results shown in FIG. 13. In this figure as well, black dots indicate the characteristics of magnetostrictive layer 6 of this embodiment, while the white dots indicate the characteristics of the prior art magnetostrictive layer 6. As these results make clear, the magnetostrictive torque sensor of this embodiment provides stable detection sensitivity over a wide range of temperatures from low temperatures to high temperatures 200 degrees C. and higher. This guarantees stable detection sensitivity when the device is used in motors such as internal combustion devices (automobile engines), which have an environmental temperature of approximately 170 degrees C.

Thus, because a non-crystallized magnetostrictive alloy layer is firmly formed on the molecular level on the surface of a rotating motor shaft via a mutually diffused layer, this magnetostrictive torque detector provides superior stress-magnetism sensitivity as well as superior linearity.

Production embodiment 3—Intermediate layer ribbon

Figure 5A:
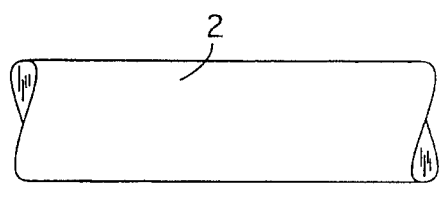
FIG. 5 is a summary drawing indicating a method for making a shaft having a magnetostrictive torque detector as in production embodiment 3.

Shaft 2 was prepared as is indicated in FIG. 5(A). The material used for shaft 2 is not particularly specified, but can be materials such as Fe—Mn—Cr—Ni—V—Si—C type steel, SNCM439 or the like.

First, shaft 2 was washed. After washing shaft 2, two rows of intermediate layer 4, 4 are formed with prescribed intervals in prescribed positions on the outer perimeter in the direction of the axis of shaft 2, as indicated in FIG. 5(B). Intermediate layers 4, 4 are made of a thin membrane containing nickel, such as a Ni layer or a Ni—P layer deposited by electrical plating or non-electrical plating. The desirable membrane thickness of intermediate layer 4, 4 is about 10–100 μm, as noted above. This membrane thickness should be adequate to prevent diffusion of impurities from shaft 2 into the magnetostrictive material layer during the heat treatment conducted to form the magnetostrictive torque detector and also should not affect torque transmission from shaft 2 to the magnetostrictive material layer.

The composition of the plating bath for forming the Ni—P membrane through plating is for example as follows:

$Ni_2SO_4 \cdot 6H_2O$: 14 g/liter;

$H_3BO_4$: 15 g/liter;

$NH_4Cl$: 16 g/liter;

$NaH_2PO_2 \cdot H_2O$: 5 g/liter.

Figure 5C:
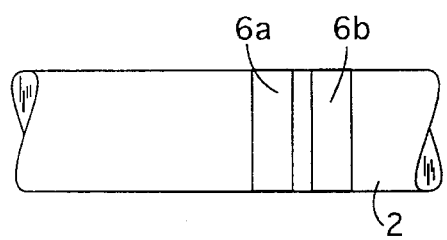
Figure 5B:
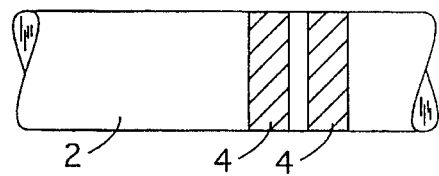

Then, as indicated in FIG. 5(C), the magnetic alloy ribbon for the metallic, non-crystallized magnetostrictive material layer 6 was temporarily fixed to the outer perimeter of intermediate layer 4 by spot welding or the like. The desirable thickness for the ribbon would be about 50–100 μm. The ribbon could be made of a magnetic alloy having a saturated magnetostrictive constant of $30 \times 10^{-6}$ or greater such as the following: $Fe_X B_m Si_n$ [X+m+n=1.0, where 0.65<X<0.80, 0.20<m+n<0.35, 0.02<m<0.33], $(Fe_{0.9}Co_{0.1})_{0.78}Si_X B_Y$ [X+Y=0.22], $(Fe_X Ni_Y)Mo_m B_n$ [X+Y+m+n=1.0, where 0.70<X+Y<0.80, 0.30<X<0.50, 0.20<m+n<0.30, 0.02<m<0.10],$(Fe_{0.9}Co_{0.1})_{0.78}Si_X B_Y$[X+Y=0.22], Co-40% Fe, Fe-13% Al, $Fe_3O_4$, $TbFe_2$, Tb-30% Fe, $Tb(CoFe)_2$, $Tb(NiFe)_2$, $TbFe_3$, $DyFe_2$, or the like.

Figure 6:
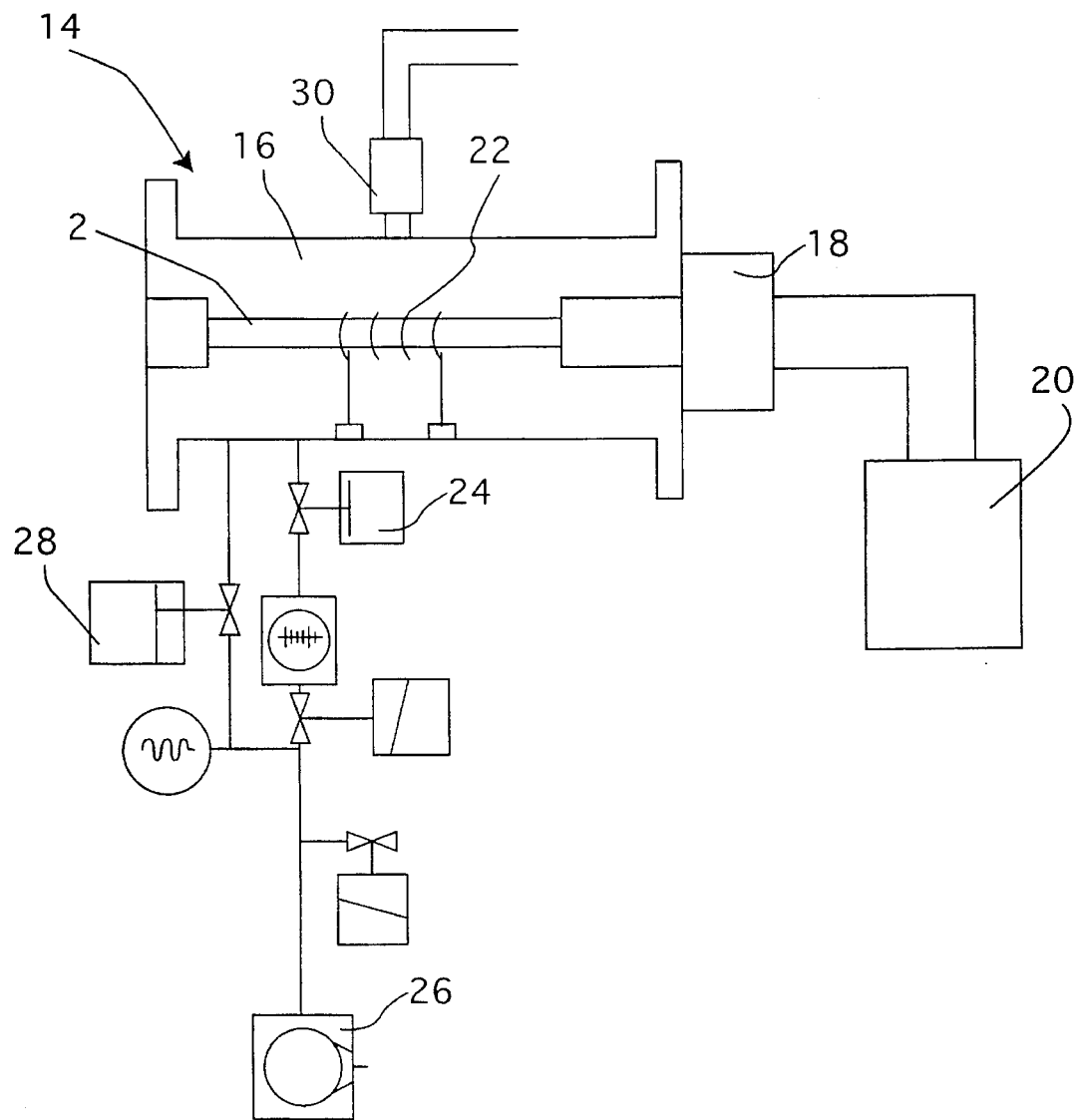
FIG. 6 is a summary drawing of a heat treatment device used in production embodiment 3.

Next, shaft 2, on which the ribbon was temporarily fixed, was heat treated using a high-frequency welding device 14 or the like, as shown in FIG. 6. Device 14 has a vacuum chamber 16 that holds shaft 2, and is made so that a shaft rotation device 18 turns shaft 2. Shaft rotation device 18 is controlled by rotation control device 20.

A coil 22 for high-frequency heating of the outer perimeter of shaft 2 is arranged within vacuum chamber 16. Vacuum chamber 16 is connected to a turbo molecular pump 24, a rotary pump 26, other pumps 28, and various control valves so that it can maintain a high degree of vacuum within it.

The high frequency applied to coil 22 can be, for example, 70 kHz. A pyrometer 30 and the like controls the outer perimeter temperature of shaft 2 when it is being heated by coil 22. This temperature can be about 900–1200 degrees C. This heating temperature is determined so that it is adequate for forming a diffusion junction between the ribbon made of magnetostrictive material and the outer perimeter of shaft 2 via intermediate layer 4. The temperature is also determined so that it does not damage the magnetostrictive properties of magnetostrictive material layer 6. Also, the temperature needs to be below the melting temperature of shaft 2.

The heat treatment of the entire shaft can be carried out not only with the high-frequency heating indicated in FIG. 6, likewise during this heat treatment it can also be done with a vacuum furnace or an atmosphere furnace. With this kind of heat treatment, magnetostrictive material layer 6 and intermediate layer 4 and shaft 2 can form a firm diffusion junction. During this heat treatment, intermediate layer 4 prevents components of the shaft material from shaft 2 from diffusing into magnetostrictive material layer 6. This prevents damage to the counter-magnetostrictive properties of magnetostrictive material layer 6. Magnetostrictive material layer 6 receives diffusion of shaft material components from shaft 2 to a certain extent.

The corrosion resistance of magnetostrictive material layer 6 improves because of factors such as the diffusion of nickel from intermediate layer 4, which contains nickel, to magnetostrictive material layer 6 to an extent that the nickel does not affect magnetostrictive properties during this heat treatment. This heat treatment also almost completely crystallizes magnetostrictive material layer 6.

Next, magnetostrictive material layer 6 was exposed to one of an electron beam and a laser beam, resulting in a further decrystallization of this layer. When an electron beam was used, decrystallizing heat treatment was conducted under the following conditions: vacuum atmosphere: $2 \times 10^{-4}$ Torr; electron beam output: 1000 W; beam diameter: 0.4 mm; amplitude: 30 mm; frequency: 200 Hz; scan speed: 70 mm/s; exposure time: 10 seconds.

Use of the electron beam melt quenching device provided a melting depth of 50 micrometers or greater, and also allowed a almost uniform distribution of the melting depth, almost completely decrystallizing magnetostrictive layer 6.

When this electron beam exposure method is used, the electron beam scan width and scan direction can be controlled with a program. Also, since the electron beam is not a light, it can be used regardless of the optical properties of the surface. As a result, an Fe—Co—Si—B membrane with thickness 50 μm can be easily uncrystallized, resulting in a high-sensitivity non-crystallized $(Fe_{0.9}Co_{0.1})_{0.78}Si_X B_Y$ membrane [X+Y=0.22].

Following the heat treatment of the entire shaft 2, heat treatment using beam exposure allows a uniform junction between non-crystallized material layer 6 and intermediate layer 4. As a result, the bonding strength between non-crystallized magnetostrictive material layer 6 and shaft 2 is 20 kg/mm², and the durability is 107 cycles or greater, where one cycle is one rotation when torque is applied. Furthermore, the $(Fe_{0.9}Co_{0.1})_{0.78}Si_X B_Y$ which composes non-crystallized magnetostrictive material layer 6, during this heat treatment, does not generate any dislocation in its composition, and has high-sensitivity magnetic properties.

Figure 5D:
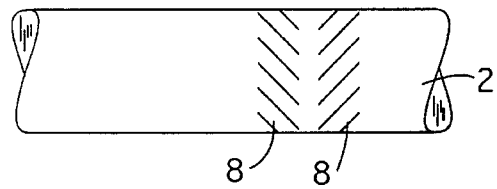

Next, as indicated in FIG. 5(D), torque detectors 8, 8 were processed in two rows of slit patterns on the surface of de-crystallized magnetostrictive material layer 6 along the outer perimeter of shaft 2. The slits were inclined in opposite directions at an angle of approximately 45 degrees relative to the axis. This kind of pattern is known as a "chevron" pattern. The means for producing this kind of pattern are known and thus not further specified, but machine processing such as grinding or rolling processes are suitable. Furthermore, since the present invention features a firm junction between the magnetostrictive layer and the shaft, the magnetostrictive layer surface can be finished to the prescribed dimensions through cylindrical grinding processing, thus improving measurement accuracy as well.

In this embodiment, the pattern processing of the magnetostrictive material layer on the surface of the shaft is performed by machine processing after the magnetostrictive layer is formed, but, as indicated in FIG. 9, machine-processing concavities on the shaft beforehand makes it possible to skip the masking process. Furthermore, the depth of the concavities makes it easy for the slurry to be applied with uniform thickness, as in production embodiment 1, 2.

It also allows the formation of the magnetostrictive layer thickness only at the concavities to be the prescribed dimension when cylindrical grinding is performed on shaft 2 on which magnetostrictive layer 6 is fixed, and when the magnetostrictive material layer is formed in the concavities, grinding excess magnetostrictive material layer can provide a smooth profile for the detector, further improving sensitivity and simplifying the procedure for producing magnetostrictive detector 8.

Regarding shaft 2 of this embodiment characterized by a de-crystallized magnetostrictive material layer 6 that serve as torque detectors 8, 8 formed in the prescribed pattern this way, FIG. 14 shows the results of a survey of the change in inductance of de-crystallized magnetostrictive material layer 6 (torque detection sensitivity) in relation to the torque applied to shaft 2 under conditions of 90% humidity and 60 degrees C. temperature. In this figure, the black dots indicate the results of torque detection using a shaft having a magnetostrictive torque detector of this embodiment.

The black triangles indicate the results of studying the torque detection sensitivity using a shaft with a torque detector formed from a magnetostrictive material layer using prior art synthetic resin adhesive (epoxy adhesive).

Figure 15:
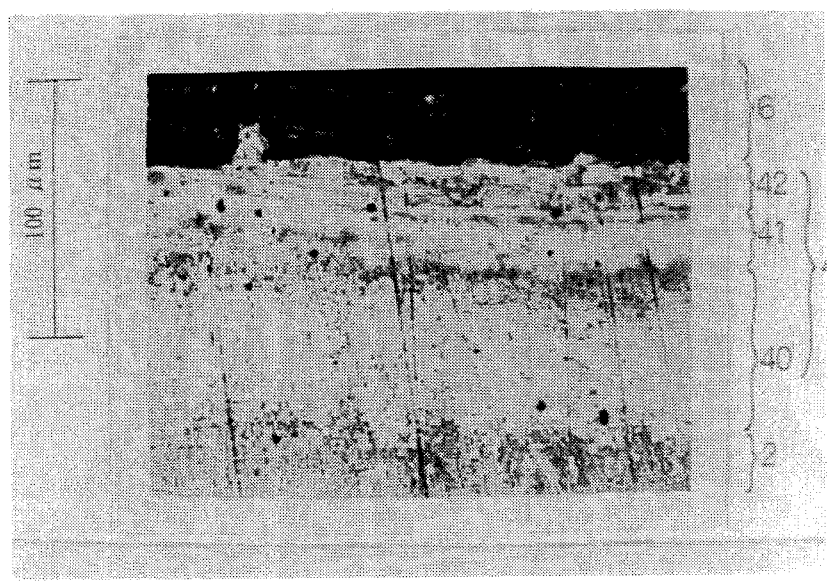
FIG. 15 is a scanning electron photomicrograph indicating the metal composition of a cross section of a main part of the torque detector as in production embodiment 3 of the present invention.

FIG. 15 shows the result of a scanning electron photomicrograph study of the cross section of a piece cut off of torque detector 8. As the results indicate, magnetostrictive material layer 6 with thickness 20–40 micrometers formed well, and first, second and third intermediate layer 40, 41, 42 which make up intermediate layer 4 is in the middle of this.

Table 1 indicate the results of an EPMA study of the components at various points of magnetostrictive material layer 6 and first, second and third intermediate layers 40, 41, 42.

TABLE 1

| | Results/EPMA | | | | | | |
| --- | --- | --- | --- | --- | --- | --- | --- |
| | Fe | Co | Si | B | Ni | Mn | Cr |
| magnetostrictive material layer 6 | 62.9 | 14.7 | 0.7 | 21.3 | 0.2 | <0.1 | <0.1 |
| 3d intermediate layer 42 | 76.6 | 19.8 | 3.0 | 0.0 | 0.6 | <0.1 | <0.1 |
| 2d intermediate layer 41 | 31.6 | 10.1 | 3.6 | 0.0 | 54.6 | <0.1 | <0.1 |
| 1st intermediate layer 40 | 68.4 | 1.0 | 1.7 | 0.0 | 12.5 | 5.9 | 10.4 |

The figures in Table 1 are atomic percentages.

Referring to Table 1, almost no Mn or Cr (which are shaft components) diffused into magnetostrictive material layer 6, and the composition was close to the composition of the ribbon before heat treatment. This lends credence to the thesis that intermediate layers 40, 41, were able to prevent diffusion of the shaft components into the magnetostrictive material layer.

Figure 16:
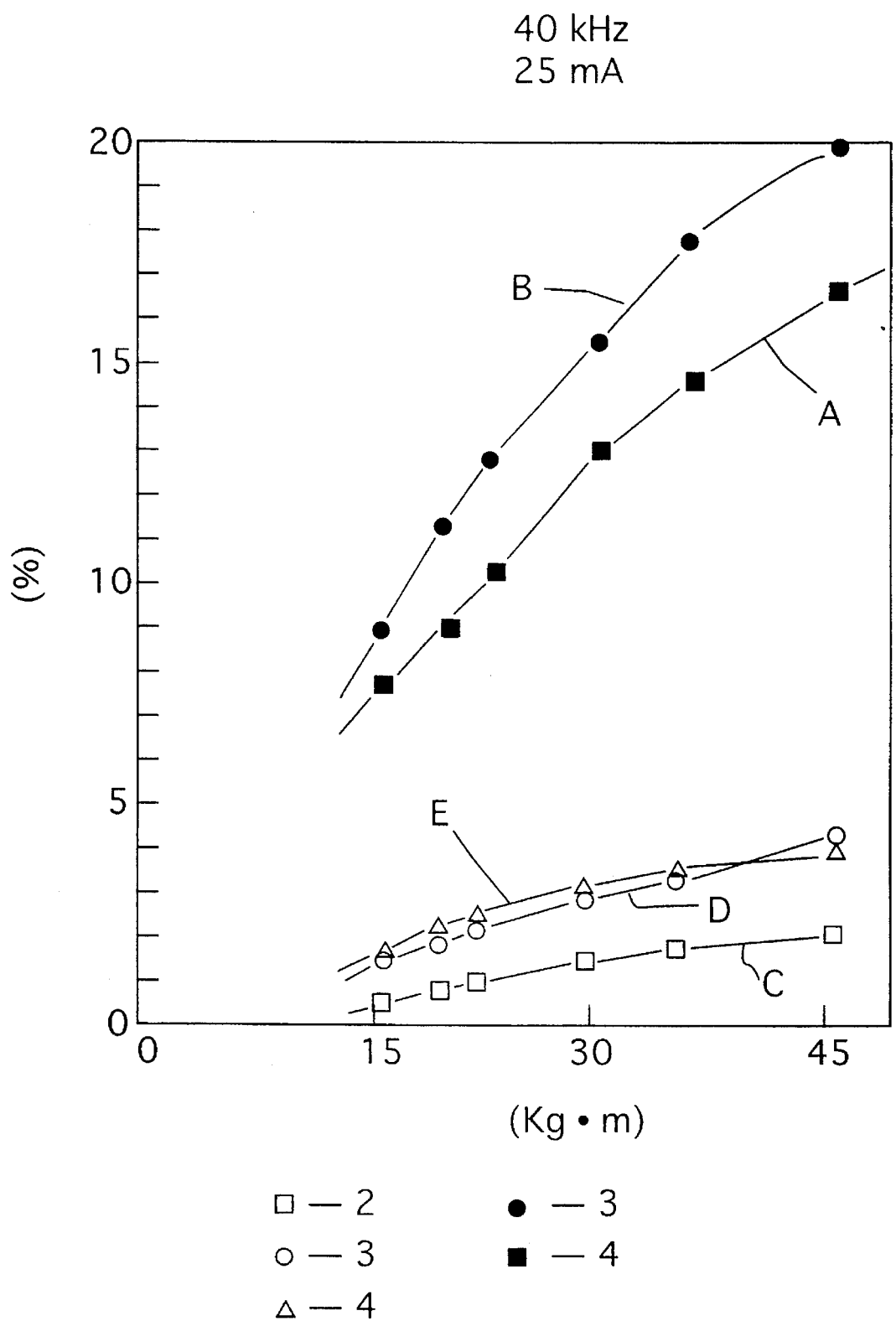
FIG. 16 is a graph indicating the results of a survey of the rate of change of inductance for production embodiments 3, 4 of the present invention.

Also, regarding the shaft having a torque detector made by the method according to production embodiment 3, curve A in FIG. 16 shows the results of a survey of the rate of change of inductance relative to applied torque. The excitation frequency during this was 40 kHz and the excitation current was 25 mA.

Production embodiment 4—Intermediate ribbon 2

A shaft having a torque detector was produced in a manner similar to the method according to production embodiment 3 (as discussed above) except for electroless plating a nickel layer approximately 20 µm thick. The results of a photomicrograph study of a cross-section of the torque detector are shown in FIG. 17.

Figure 17:
FIG. 17 is a photomicrograph indicating the metal composition of a cross section of a main part of the torque detector as in production embodiment 4 of the present invention.

Referring to FIG. 17, intermediate layer 4, and magnetostrictive material layer 6, are illustrated by the electron micrograph to show that they are well-formed.

Regarding the shaft having a torque detector made according to production embodiment 4, curve B of FIG. 16 shows the results of studying the rate of change of inductance in relation to applied torque.

Production embodiment 5—dipping

Figure 7A:
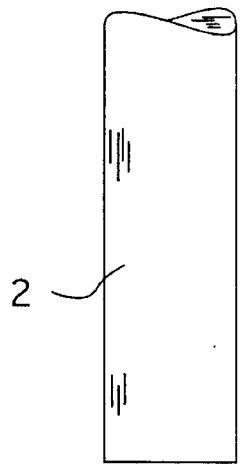
FIG. 7 is a summary drawing indicating the method for making a shaft having a magnetostrictive torque detector as in production embodiment 5, 6.

Referring to FIG. 7(A), the method of this embodiment involved preparing a shaft 2. The material used for shaft 2 may be one of known alloys, or SNCM 439 steel or the like can be used. Shaft 2 was then washed.

Figure 7B:
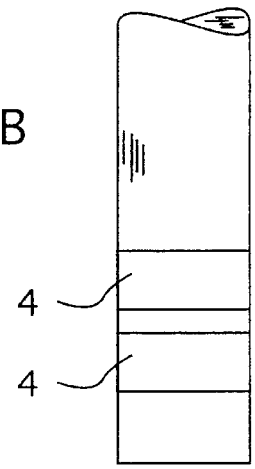

Referring to FIG. 7(B), after washing shaft 2, two rows of base layers 4, 4 were formed at prescribed intervals on the outer perimeter at prescribed positions along the axis direction of shaft 2. Base layers 4, 4 were thin membranes containing nickel, and can also include at least one of a Ni layer and an Ni—P layer deposited by means of at least one of an electro-plating and electroless plating methods.

The thickness of the base layers 4, 4 is not particularly specified, but a thickness of about 10 to about 50 µm is desirable. This membrane thickness helps prevent impurities from diffusing from shaft 2, into the magnetostrictive material layer stacked on base layers 4, 4. Additionally, the specified thickness does not adversely effect transmission of torque from shaft 2, to the magnetostrictive material layer.

The plating bath for plating an Ni—P membrane was composed of at least one or more of the following, in the prescribed proportions:

NiSO$_4$·6H$_2$O: 14 g/liter; H$_3$BO$_4$: 15 g/liter; NH$_4$Cl: 16 g/liter; NaH$_2$PO$_2$·1H$_2$O: 5 g/liter.

Figure 7C:
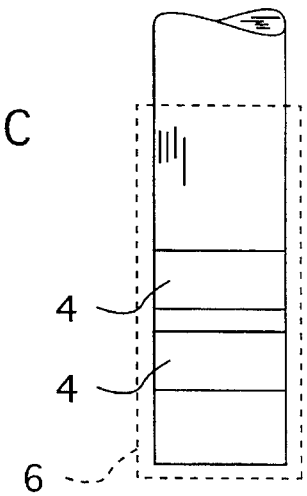

Next, referring to FIG. 7(C), a de-crystallized magnetostrictive material layer 6, was formed on the outer perimeter of shaft 2, which has a base layer 4, using the dipping method. The device used to form de-crystallized magnetostrictive material layer 6, with the dipping method can be a device such as dipping device 40, shown in FIG. 8. In this device, within chamber 41, a shaft supporting base 42, supports the top end of shaft 2, while shaft support rod 44, supports shaft support base 42. Support rod 44, is freely movable in its axis direction, and can dip shaft 2, which is supported on the tip of said rod, into melting crucible 46.

Melting crucible 46, can be at least on of Al$_2$O$_3$ crucible and an MgO crucible. Within it is molten magnetostrictive material. A heating coil 48 is mounted around crucible 46, to melt the magnetostrictive material at a prescribed temperature. A thermocouple 50, is mounted to crucible 46 to serve as a temperature sensor. The temperature data detected by thermocouple 50, is sent to power supply controller 52, as a means for controlling the heating coil, so that heating coil 48, is controlled to be at a prescribed heating temperature. Crucible 46, is arranged on a platform 56, via a heat-insulating material.

Within chamber 41, a gas supply opening 58, introduces an inert gas or the like. The inert gas could be argon gas, for example. The pressure within the chamber is not particularly specified, but can be one atmosphere, for example.

The magnetostrictive material melted in crucible 46, was a magnetostrictive material for forming a de-crystallized magnetostrictive material layer having a saturated magnetostrictive coefficient of at least $30 \times 10^{-6}$. Included therein is at least one material selected from the group comprising $(Fe_{0.9}Co_{0.1})_{0.78}Si_XB_Y$ [X+Y=0.22]; Co-40% Fe; Fe-13% Al; $Fe_3O_4$; $TbFe_2$; Tb-30% Fe; $Tb(CoFe)_2$; $Tb(NiFe)_2$; $TbFe_3$, $DyFe_2$, and similar alloys.

If a de-crystallized layer represented by the formula $(Fe_{0.9}Co_{0.1})_{0.78}Si_XB_Y$, wherein X+Y=0.22 is formed as the de-crystallized magnetostrictive material layer, the magnetostrictive material layer melted in crucible 46 can be made in the following manner.

Initially, Fe, Co, Si, B powders are mixed according to an atomic percentage as follows:

Fe: 70.2%,

Co: 7.8%,

Si: 8%, and

B: 14%. The total weight can be 500 g, for example.

The resultory powder mix is melted in an inert gas atmosphere such as argon gas, using a plasma arc furnace or the like, forming a magnetostrictive material preform. The arc current and the arc voltage of the plasma arc furnace can be about 200 A and 40 V, respectively.

After pulverizing the resultory preform, it is placed in crucible 46 of device 40 indicated in FIG. 8, and melted at a temperature of approximately 1200 degrees C., and then awaits the dipping of shaft 2. The dipping time of shaft 2 is not particularly specified, but is preferred to be about 10 seconds.

After shaft 2 is dipped for the above specified dipping time, shaft 2 is removed from crucible 46 and cooled. Referring to FIG. 7(C), de-crystallized magnetostrictive material layer 6 of, for example, represented by the formula $(Fe_{0.9}Co_{0.1})_{0.78}Si_XB_Y$[X+Y=0.22], is formed on the surface of base layer 4 as well as the surface of shaft 2. The thickness of de-crystallized magnetostrictive material layer 6 is not particularly specified, but a desirable thickness would be about 50 to about 100 μm.

De-crystallized magnetostrictive material layer 6 formed by dipping on the surface of base layer 4 is bonded firmly to the surface of shaft 2 via base layer 4. The heat during dipping diffuses nickel contained in base layer 4 to magnetostrictive material layer 6 to an extent that it does not affect magnetostrictive properties. This improves corrosion resistance of magnetostrictive material layer 6. Base layer 4 prevents diffusion of impurities from shaft 2 to the magnetostrictive material layer, thus preventing deterioration of magnetostrictive properties of magnetostrictive material layer 6.

Figure 7D:
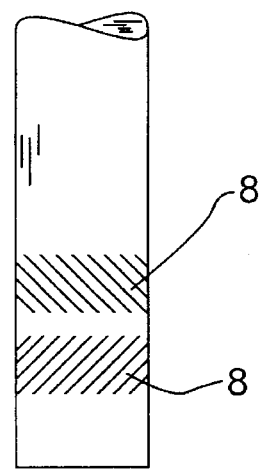
Figure 9A:
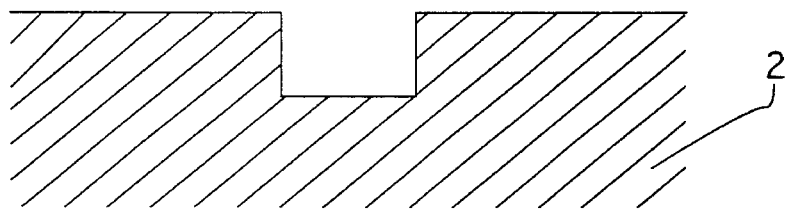
FIG. 9 indicates the main parts of detector 8 made according to other methods suggested in production embodiments 1, 2, 5, 6 (forming concavities after forming a magnetostrictive layer on the shaft).
Figure 9B:
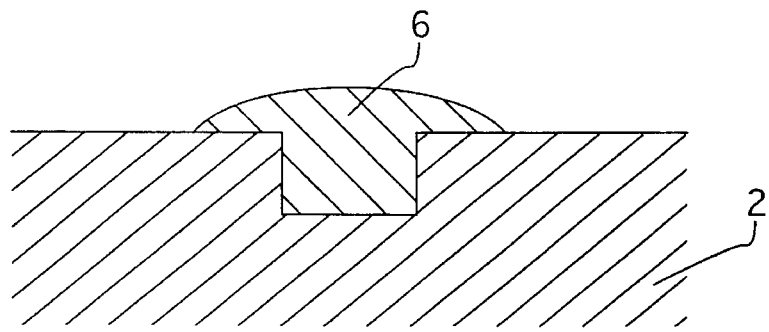
Figure 9C:
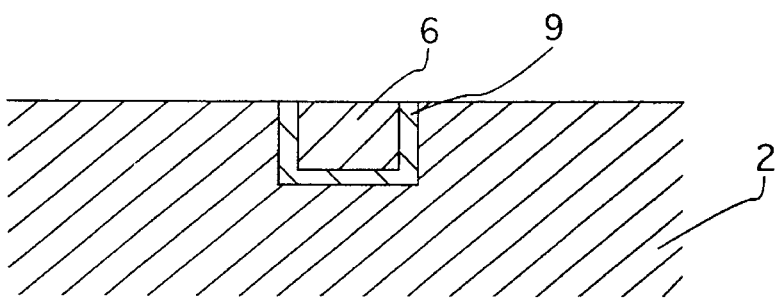
Figure 9D:
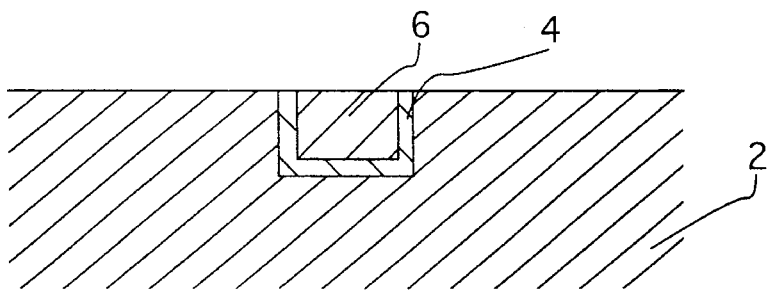

Referring to FIG. 7(D), two rows of slit patterns inclined at 45 degree angles relative to the axis direction in mutually opposite direction were processed on de-crystallized magnetostrictive material layer 6 along the outer perimeter of shaft 2. These form torque detector 8,8. This kind of pattern is known as the so-called "chevron" pattern. The means for forming this pattern is not particularly specified, but involve machine processing methods such as at least one of grinding, rolling and similar procedures.

Referring to FIG. 9, after machine-processing concavities on the shaft beforehand, excess magnetostrictive material, excluding the concavities, formed by dipping can be eliminated by cylindrical grinding, and the thickness of the magnetostrictive material formed in the concavities can be maintained at a prescribed dimension. This allows greater bonding area between the shaft and the magnetostrictive material formed in the concavities, further increasing the directness of the transmission of torque from the shaft.

Production embodiment 6

After de-crystallized magnetostrictive material layer 6 is formed on the outer perimeter of shaft 2 using the dipping method in production embodiment 5, heat treatment can be conducted on de-crystallized magnetostrictive material layer with an electron beam or a laser beam before or after the slits were processed in a pattern for the magnetostrictive torque detector.

When using an electron beam, the following conditions for decrystallization heat-processing can be used—vacuum: a vacuum atmosphere of $2 \times 10^{-4}$ Torr, emission current: 50 mA, acceleration voltage: 10 kV, beam diameter: 0.4 mm, amplitude: 30 mm, frequency: 200 Hz, scan speed: 180 mm/s, exposure time: 10 seconds. This electron beam melt extraction can provide a melting depth of 50 micrometers or greater, and forms an approximately uniformly distributed melting depth, and almost completely decrystallizes magnetostrictive layer 6.

Use of the electron beam exposure method also allows control of the scan width and scan direction of the electron beam with a program. Also, since the electron beam is not a light, it can be used regardless of the optical properties of the surface. As a result, an Fe—Co—Si—B membrane with 50 micrometers thickness can be easily decrystallized, to be made into a high-sensitivity de-crystallized $(Fe_{0.9}Co_{0.1})_{0.78}Si_XB_Y$ [X+Y=0.22] membrane.

By performing heat treatment with beam exposure, decrystallized magnetostrictive material layer 6 and base layer 4 and shaft 2 were uniformly bonded. As a result, the bonding strength between decrystallized magnetostrictive material layer 6 and shaft 2 is 20 kg/mm² or greater, and durability is 107 cycle or greater, where one cycle is one rotation when torque is applied. Furthermore, the $(Fe_{0.9}Co_{0.1})_{0.78}Si_XB_Y$ [X+Y=0.22] layer making up decrystallized magnetostrictive material layer 6 does not show any dislocation of composition, and has high-sensitivity.

Also, beam exposure allows diffusion of nickel contained in base layer 4 to magnetostrictive material layer 6 within a range that does not affect magnetostrictive properties, improving corrosion resistance of magnetostrictive material layer 6. Also, since base layer 4 prevents diffusion of impurities from shaft 2 to the magnetostrictive material layer, so the reverse magnetostrictive properties of magnetostrictive material layer 6 were not affected.

Heat treatment from beam exposure is not limited to the use of electron beams, and can involve the use of laser melt quenching. In this case, in a nitrogen atmosphere, a laser beam can be used for decrystallizing an Fe—Co—Si—B membrane under the following conditions—laser output: 1.0–4.8 kW, beam diameter 0.43 mm, peripheral speed: 0.08–2.0 m/s. As a result, the Fe—Co—Si—B membrane can be easily decrystallized, creating a highly sensitive decrystallized $(Fe_{0.9}Co_{0.1})_{0.78}Si_XB_Y$ [X+Y=0.22]. In this embodiment, the operation described above does not need to be conducted in a vacuum, simplifying the device that needs to be used. Other details, such as composition and operation are identical to those of the embodiments described above.

Furthermore, the method for making this embodiment does not necessarily require the formation of a base layer 4, and can involve directly forming a decrystallized magnetostrictive layer 6 using the dipping method on the outer perimeter of shaft 2. However, in the case of this embodiment, effectiveness due to the use of a base layer 4 can not be expected.

Production embodiment 7—thermal-spray crystallization

Referring to FIG. 9, an endmill is used to process concavities in a chevron pattern on an Fe base shaft 2 (Fe; Mn 13%, Cr 10%, Ni 2.2%, V 2.0%, Si 1.0%, C 0.6% weight %). The concavities were processed with thickness 350 micrometers and width 5 mm. After washing shaft 2, an alloy powder having particle size 40 micrometers or lower with components $Fe_{0.78}B_{0.13}Si_{0.09}$ is formed on the shaft pattern at 300 micrometers using a plasma thermal spray. The conditions for the thermal spray were as follows—Ar plasma input power: 500 A×70 V, Ar gas flow: 43 l/min, powder supply rate: 20 g/min, shaft rotation speed: 700 rpm, plasma torch scan speed: 1 cm/sec, thermal spray width: 35 mm. The thermal spraying is repeated 20 times. Then, using the heat treatment device in FIG. 6, magnetostrictive layer 6 formed by thermal spraying is joined to shaft 2 under the following conditions—vacuum: $10^{-4}$ Torr, frequency: 110 kHz, power: 1.2 kW, shaft rotation speed: 30 rpm, time: 1 minute.

After that, shaft 2 is ground so that the excess magnetostrictive layer 6 excluding the chevron-pattern concavities and including part of shaft 2 were removed, resulting in magnetostrictive layer 6 being formed in the chevron-pattern concavities only, with a thickness of 250 micrometers.

Production embodiment 8—thermal spray

Similarly, chevron-pattern concavities, having identical dimensions as those on production embodiment 7, were formed on shaft 2, having identical dimensions and identical material as in production embodiment 7. A magnetostrictive layer 6 is formed on the chevron pattern of shaft 2 by taking an alloy powder having molar composition of Fe 0.40,Ni 0.38,B 0.18 having an average particle size of 30 micrometers and spraying it through a plasma are thermal spray under the following conditions—Ar gas flow: 40 l/min, plasma input power: 500 A×70 V, powder supply rate: 18 g/min, shaft rotation speed: 650 rpm. The plasma torch has a scan width of 35 mm and scan speed of 1.5 cm/sec. The spray is repeated 20 times. The thickness of magnetostrictive layer 6 is 300 micrometers. Then, shaft 2 is fused to magnetostrictive layer 6 by heating shaft 2 in a heat treatment device, as shown in FIG. 6, in an Ar gas atmosphere under the following conditions—vacuum: 10 torr, frequency: 100 kHz, high-frequency power: 2 kW, shaft rotation speed: 10 rpm, time: 50 sec. Furthermore, by grinding shaft 2, the excess magnetostrictive layer 6 formed on shaft 2 and part of the surface of shaft 2 were eliminated, forming a magnetostrictive layer 6 in a chevron pattern with a thickness of 250 micrometers.

Figure 22:
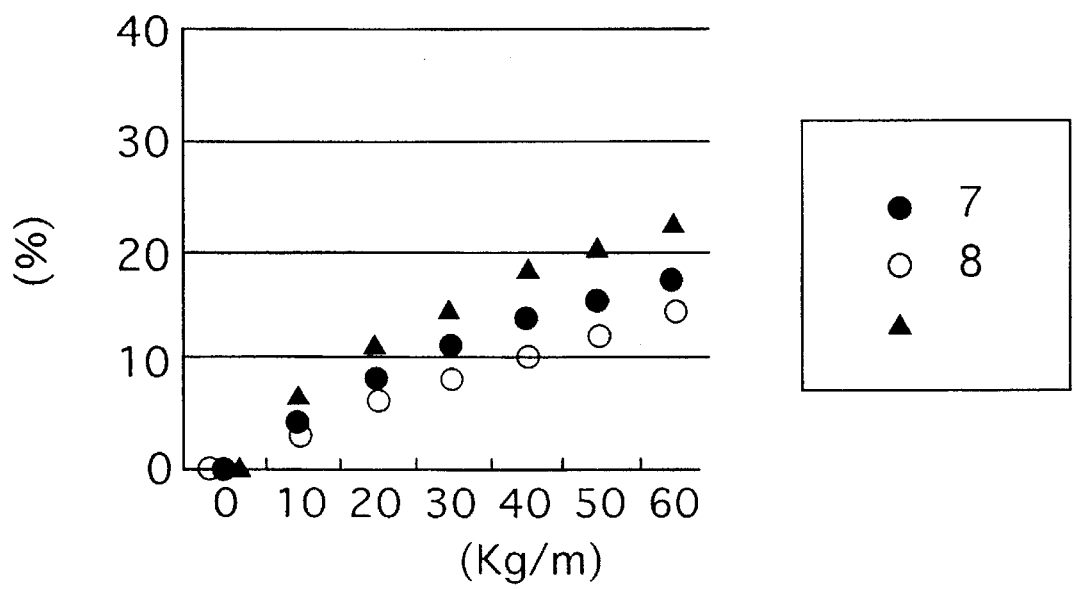
FIGS. 22–23 are graphs indicating the operation of production embodiments 7, 8 of the present invention.
Figure 23:
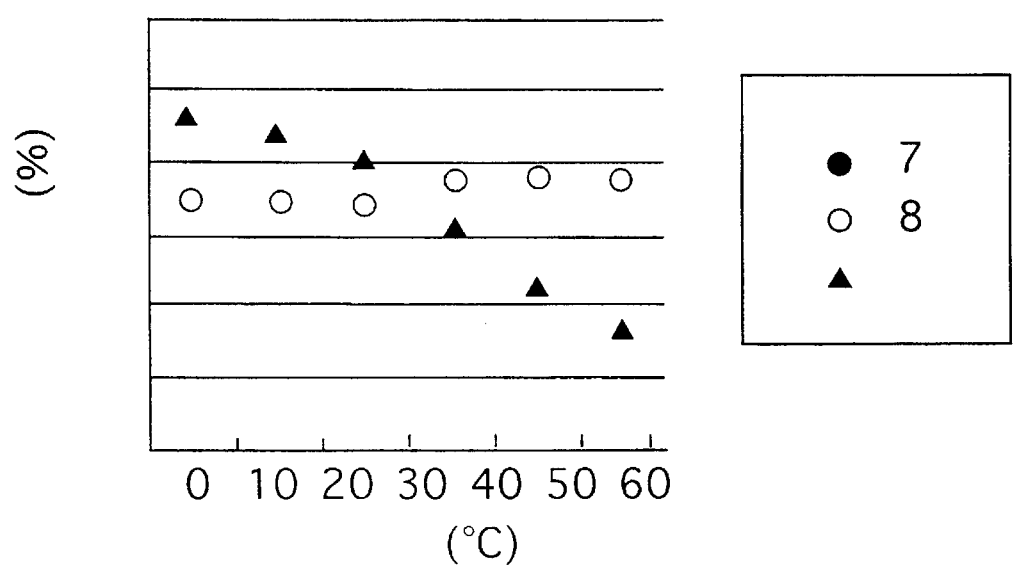

As in production embodiments 1, 2, the shafts having a crystallized magnetostrictive detector 8 formed in production embodiments 7,8 noted above were studied to find the change in inductance of magnetostrictive layer 6 in normal temperatures. The results were shown in FIG. 22, and FIG. 23 shows corrosion resistance using the same evaluation as used in production embodiments 1, 2. In the drawings, the black dots indicate the magnetostrictive layer of production embodiment 7, the white dots indicate the magnetostrictive layer of production embodiment 8, and the black triangles indicate the magnetostrictive layer in which the prior art synthetic resin adhesive (epoxy adhesive) forms a decrystallized magnetostrictive layer, and a non-magnetostrictive material layer covers the magnetostrictive layer.

Comparative embodiment 1

A shaft having a torque detector was produced in a manner similar to production embodiment 6 (as discussed above), except that instead of plating the outer perimeter of the shaft with a nickel layer, a ribbon was wrapped around the outer perimeter of the shaft four times, spot welded and then heat treated at approximately 955 degrees/C. The results of an SEM study of a cross-section of the torque detector is shown in FIG. 18.

Figure 18:
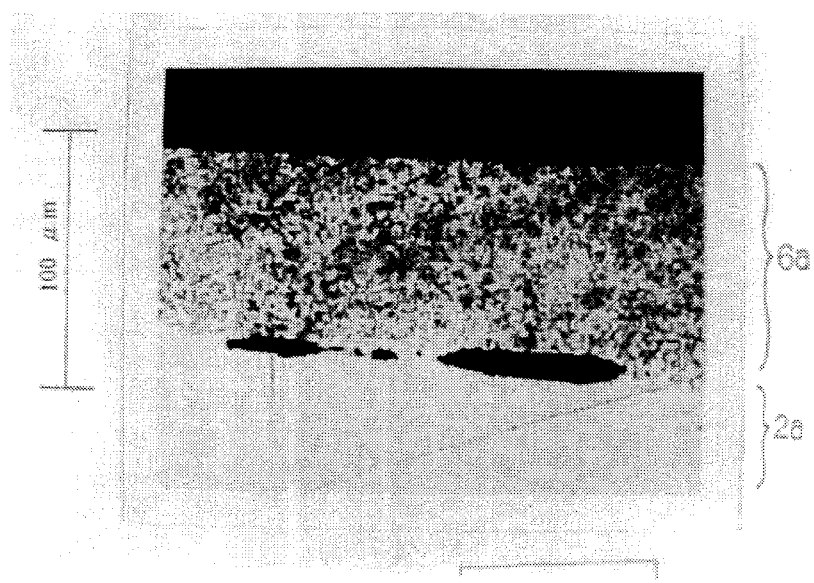
FIG. 18 is a photomicrograph indicating the metal composition of a cross section of a main part of the torque detector as in comparative embodiment 1 of the present invention.

Referring to FIG. 18, a gap is illustrated by the photomicrograph formed between magnetostrictive material layer 6a, and shaft 2a, making the bond inadequate.

Comparative embodiment 2

A shaft having a torque detector was produced in a manner similar to embodiment 1 (as discussed above), except that instead of plating the outer perimeter of the shaft with a nickel layer, a ribbon was wrapped around the outer perimeter of the shaft four times, spot welded and then heat-treated at a predetermined temperature ranging from about 1030 to about 1040 degrees C.

Figure 19:
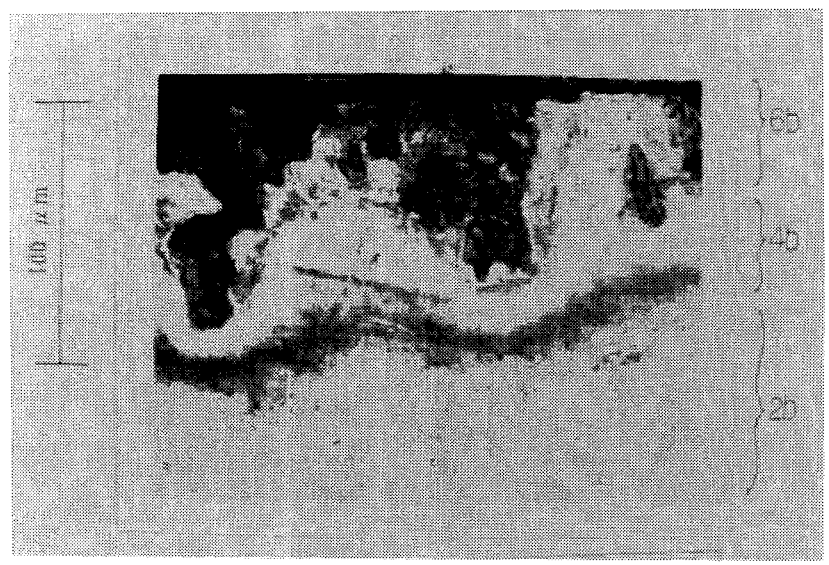
FIG. 19 is a photomicrograph indicating the metal composition of a cross section of a main part of the torque detector as in comparative embodiment 2 of the present invention.

The results of a photomicrograph study of a cross-section of the torque detector is shown in FIG. 19. Referring to FIG. 19, the photomicrograph illustrates an intermediate layer 4b, which was formed between magnetostrictive material layer 6b, and shaft 2b, but the diffusion was not uniform. Additionally the figure is illustrative of how the intermediate layer 4b, meanders. The lack of uniformity is shown by the turning and winding course of intermediate layer 4b, as shown in the photomicrograph.

Regarding the shaft having a torque detector made according to comparative embodiment 2, curve C in FIG. 16 indicates the results of a survey of the rate of change in inductance in relation to applied torque.

Referring to FIG. 16, this magnetostrictive properties of this embodiment were inferior to those of production embodiments 3, 4. It is believed that a plurality of different shaft components such as Mn, Cr are diffused into magnetostrictive material layer 6b.

Comparative embodiment 3

A shaft having a torque detector is made, according to production embodiment 3 (as discussed above), except that instead of plating the outer perimeter of the shaft with a nickel layer, a ribbon is wrapped around the outer perimeter of the shaft eight times so that the total thickness of the ribbon layer is approximately 200 micrometers. According to this embodiment, the ribbon is spot-welded and then heat-treated at a temperature setting of from about 1030 to about 1040 degrees C.

Figure 20:
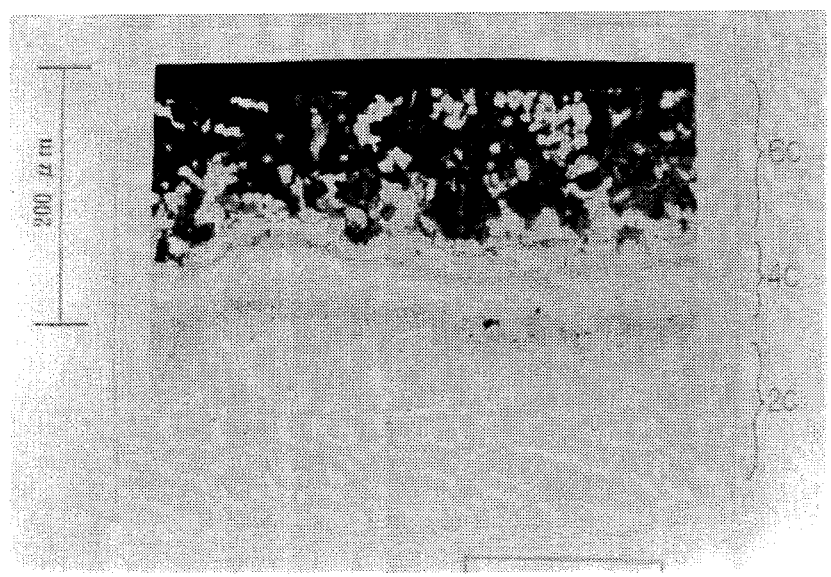
FIG. 20 is a photomicrograph indicating the metal composition of a cross section of a main part of the torque detector as in comparative embodiment 3 of the present invention.

The results of a photomicrograph study of a cross-section of the torque detector are shown in FIG. 20. Referring to FIG. 20, the electron micrograph illustrates an intermediate layer 4c, which is formed between magnetostrictive material layer 6c, and shaft 2c.

Regarding the shaft having a torque detector made in comparative embodiment 3, curve D in FIG. 16 shows the results of a survey of the rate of change in inductance in relation to applied torque.

Referring to FIG. 16, a deterioration in magnetostrictive properties compared to production embodiments 3, 4 was observed. It is believed that a large quantity of different of shaft components such as Mn, Cr are diffused into magnetostrictive material layer 6c.

Comparative embodiment 4

Figure 21:
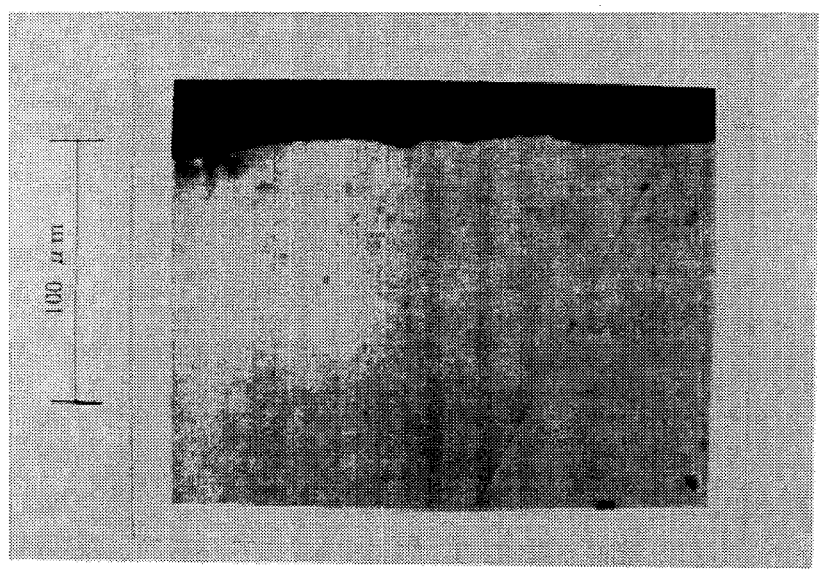
FIG. 21 is a photomicrograph indicating the metal composition of a cross section of a main part of the torque detector as in comparative embodiment 4 of the present invention.

A shaft having a torque detector similar to embodiment 1 was made except that a nickel layer about 20 micrometers thick was electro-plated and then heat treated at a temperature setting of approximately 1090 degrees C. In FIG. 21, the electron micrograph illustrates the results of a photomicrograph study of a cross-section of the torque detector. Referring to FIG. 21, the diffusion junction was drastic, and the magnetostrictive material layer and the intermediate layer were formed on the shaft outer perimeter in such a way that it was not possible to distinguish them.

Regarding the shaft having a torque detector made in comparative embodiment 4, curve E in FIG. 16 indicates the results of a survey of the rate of change of inductance in relation to applied torque.

Referring to FIG. 16, FIG. 16 confirms that this embodiment had inferior magnetostrictive properties compared to the methods according to production embodiment 3 and production embodiment 4.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A shaft with a magnetostrictive torque detector comprising:

an inner shaft with a circumferential surface;

a layer of magnetostrictive magnetic alloy, wherein said magnetic alloy layer is diffusion-bonded onto said circumferential surface; wherein an intermediate layer is formed between said inner shaft and said layer of magnetostrictive magnetic alloy.

2. The shaft with a magnetostrictive torque detector of claim 1, wherein said magnetic alloy layer is crystallized.

3. The shaft with a magnetostrictive torque detector of claim 1, wherein said magnetic alloy layer is non-crystallized.

4. The shaft with a magnetostrictive torque detector of claim 1, wherein said magnetic alloy layer has a magnetostrictive constant greater than $5\times10^{-6}$.

5. The shaft of claim 1, wherein said intermediate layer contains at least one of the following: Ni, Nb, Mo, Zn, Fe, Y, Sc, Ti, Hf, Ta, W, Co, Rh, Ir, Pd, Pt, and Ni—P.

6. The shaft of claim 5 wherein:

said intermediate layer is at least one of nickel and an Ni—P alloy.

7. A shaft having a magnetostrictive torque detector as described in claim 1 wherein:

said intermediate layer has a thickness of 10–100 micrometers.

8. The shaft with a magnetostrictive torque detector of claim 1, wherein said intermediate layer has melting point greater than melting point of said layer of magnetostrictive magnetic alloy.

9. A shaft with a magnetostrictive torque detector comprising:

an inner shaft with a circumferential surface;

a layer of magnetostrictive magnetic alloy, wherein said magnetic alloy layer is diffusion-bonded onto said circumferential surface;

wherein said magnetic alloy includes at least one alloy selected from the group consisting of and represented by the formula:

$Fe_xB_mSi_n$, wherein X+m+n=1.0, and 0.65<X<0.80, 0.20<m+n<0.35 0.02<m<0.33;

$(Fe_{0.9}Co_{0.1})_{0.78}Si_xB_Y$ wherein X+Y=0.22;

$(Fe_xNi_y)Mo_mB_n$ wherein X+Y+m+n=1.0, and wherein 0.70<X+Y<0.80, 0.30<X<0.50, 0.20<m+n<0.30, 0.02<m<0.10; $(Fe_{0.9}Co_{0.1})_x(Si_mB_n)_Y$ wherein X+Y= 1.0, and where 0.75<X<0.90, 0.10<Y<0.25 and m+n=1, where 0.2<m<0.80, 0.2<n<0.81];

Co-40% Fe;

Fe-13% Al;

$TbFe_2$;

Tb-30% Fe;

Tb $(CoFe)_2$;

$Tb(NiFe)_2$;

$TbFe_3$ $Fe_3O_4$; and $DyFe_2$.

10. The shaft with a magnetostrictive torque detector of claim 9, wherein said magnetic alloy layer is crystallized.

11. The shaft with a magnetostrictive torque detector of claim 9, wherein said magnetic alloy layer is non-crystallized.

12. The shaft with a magnetostrictive torque detector of claim 9, wherein said magnetic alloy layer has a magnetostrictive constant greater than $5\times10^{-6}$.

13. The shaft of claim 9, further comprising:

an intermediate layer between said shaft and said magnetic alloy layer;

wherein said intermediate layer contains at least one of the following: Ni, Nb, Mo, Zn, Fe, Y, Sc, Ti, Hf, Ta, W, Co, Rh, Ir, Pd, Pt, and Ni—P.

14. The shaft of claim 13 wherein:

said intermediate layer is at least one of nickel and an Ni—P alloy.

15. A shaft having a magnetostrictive torque detector as described in claim 13 wherein:

said intermediate layer has a thickness of 10–100 micrometers.

16. The shaft with a magnetostrictive torque detector of claim 13, wherein said intermediate layer has melting point greater than melting point of said layer of magnetostrictive magnetic alloy.

* * * * *